US008427724B2

(12) United States Patent
Nishida

(10) Patent No.: US 8,427,724 B2

(45) Date of Patent: Apr. 23, 2013

(54) IMAGE FORMING APPARATUS AND IMAGE FORMING METHOD

(75) Inventor: Hirobumi Nishida, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 427 days.

(21) Appl. No.: 12/801,065

(22) Filed: May 20, 2010

(65) Prior Publication Data

US 2010/0296139 A1 Nov. 25, 2010

(30) Foreign Application Priority Data

May 22, 2009 (JP) ................................. 2009-124580
Sep. 11, 2009 (JP) ................................. 2009-211083

(51) Int. Cl.
*H04N 1/46* (2006.01)
*H04N 1/60* (2006.01)
*G03F 3/08* (2006.01)
*G06K 9/00* (2006.01)

(52) U.S. Cl.
USPC ............. 358/535; 358/1.9; 358/518; 382/167

(58) Field of Classification Search ................. 358/1.13, 358/502, 504, 518, 520, 530, 534, 535, 1.9; 382/167, 162, 165
See application file for complete search history.

(56) References Cited

U.S. PATENT DOCUMENTS 5,963,756 A 10/1999 Sakai et al.
7,420,708 B2 * 9/2008 Mantell ........................ 358/3.03
7,633,256 B2 * 12/2009 Reichert et al. ............... 318/602
7,869,087 B2 * 1/2011 Wang et al. .................... 358/1.9
8,145,105 B2 * 3/2012 Ueda et al. .................... 399/301
8,335,446 B2 * 12/2012 Kobayashi et al. ............. 399/66
2004/0119994 A1 * 6/2004 Minnebo et al. ............... 358/1.9
2005/0135673 A1 * 6/2005 Mantell ......................... 382/162
2007/0097641 A1 5/2007 Walters et al.

(Continued)

FOREIGN PATENT DOCUMENTS

JP 2005-106525 4/2005
JP 2008-040441 2/2008
JP 4441300 3/2010

OTHER PUBLICATIONS

Perry Y. Li, et al., "Robust Stabilization of Tone Reproduction Curves for the Xerographic Printing Process." IEEE Transactions on Control Systems Technology, vol. 9, No. 2. Mar. 2001, pp. 407-415.

(Continued)

*Primary Examiner* — Madelein A Nguyen
(74) *Attorney, Agent, or Firm* — Harness, Dickey & Pierce P.L.C.

(57) ABSTRACT

An image forming apparatus includes an image forming unit that forms an image using an electrophotographic process; a color measuring unit that measures a color of the image; a measured-value acquiring unit that acquires a measured value that is measured by the color measuring unit; and a set-value deciding unit that decides a set value related to formation of the image based on a difference between the measured value and a preset target value, wherein the set-value deciding unit determines the set value so that the image approaches a reference value in a period from a current state of the image to desired state of the image while optimizing a constraint evaluation function related to a constraint condition for the formation of the image by using an estimation equation for approximating time-series variation in a state of the image.

14 Claims, 15 Drawing Sheets

U.S. PATENT DOCUMENTS

| | | | | |
|---|---|---|---|---|
| 2008/0239344 | A1* | 10/2008 | Wang et al. | 358/1.9 |
| 2009/0220277 | A1* | 9/2009 | Andoh et al. | 399/167 |
| 2009/0238613 | A1* | 9/2009 | Ueda et al. | 399/301 |
| 2010/0034547 | A1* | 2/2010 | Swing et al. | 399/69 |
| 2010/0116021 | A1* | 5/2010 | O'Brien | 73/23.37 |

OTHER PUBLICATIONS

Abstract of JP 2005-275-854 published Oct. 6, 2005.

European Search Report dated Apr. 17, 2012.

* cited by examiner

IMAGE FORMING APPARATUS AND IMAGE FORMING METHOD

CROSS-REFERENCE TO RELATED APPLICATIONS

The present application claims priority to and incorporates by reference the entire contents of Japanese Patent Application No. 2009-124580 filed in Japan on May 22, 2009 and Japanese Patent Application No. 2009-211083 filed in Japan on Sep. 11, 2009.

BACKGROUND OF THE INVENTION

1. Field of the Invention

The present invention relates to an image forming apparatus and an image forming method.

2. Description of the Related Art

There is widely known a method for generating test patterns outside a printing area on a photosensitive element or on a transfer belt and estimating density and position information from data for reflectivity of the test patterns so as to control image-forming process conditions for an image density and an image position or the like. For example, Document 1 (Japanese Patent Application Laid-open No. 2008-40441) discloses a configuration in which test patterns for controlling decision of image-forming process conditions are generated in a plurality of locations outside an image area and the image-forming process conditions are decided according to respective results of detection of the test patterns in the plurality of locations, which enables deviation of density to be hardly affected on the decision of the image-forming process conditions even if the deviation of density occurs caused by the locations. Thus, the disclosed configuration allows achievement of cost reduction and space saving of a cleaning device while adopting an intermediate transfer system with high accuracy of image superposition, and also allows reduction of downtime of the device due to process control for image formation using the test patterns and achievement of stable image quality.

Incidentally, recently, there have been developed color production printers for realizing color-on-demand printing for outputting a large number of color documents, at high speed, such as leaflets, catalogs, reports, and bills. This type of color production printer is for use in a case where, for example, tens of millions of telephone bills and receipts are issued within an issuance time limit of about one week. Thus, continuous printing is performed day and night during the period of one week (in other words, high-speed printing of hundreds of copies per minute is continuously performed for several tens of hours). From these situations, the high-speed type of color production printers is characterized in that the printer can never be stopped during continuous operation. This is because the stop of the printer operation may be caused to fail to meet the issuance time limit for the enormous number of copies. In this regard, the high-speed type of color production printers is greatly different in terms of technology from printers (multifunction peripheral (MFP)) installed in offices.

Meanwhile, the control of the image-forming process conditions disclosed in the Document 1 is performed on "offline control", and thus the printing operation has to be stopped. Therefore, the control of the image-forming process conditions disclosed in the Document 1 cannot frequently be performed. Particularly, when the high-speed printing of hundreds of copies per minute is continuously performed for several tens of hours like the high-speed type of color production printer, the printing operation is stopped at a frequency of once in several minutes to perform the control of the image-forming process conditions, which is not advantageous to the characteristic of the high-speed type of color production printer that can never be stopped during the continuous operation. Moreover, if the continuous operation is performed without the control of the image-forming process conditions, the state of the process is largely changed, which causes degradation of image quality. More specifically, there is the necessity of a new configuration in which the control of the image-forming process conditions can be always implemented in real time on the high-speed type of color production printer without stopping the printing operation.

Disclosed, therefore, in Document 2 (Perry Y Li and Sohail A Dianat "Robust Stabilization of Tone Reproduction Curves for the Xerographic Printing Process" IEEE TRANSACTIONS ON CONTROL SYSTEMS TECHNOLOGY, VOL. 9, NO. 2, MARCH 2001) is a configuration method of a feedback control system for measuring a toner adhesion amount on the intermediate transfer belt or measuring an image fixed on a paper and adjusting and optimizing, in real time, set values of a charging device, an exposing device, and a developing device in an image forming engine using an electrophotographic process.

The charging device, the exposing device, and the developing device or the like in the image forming engine using the electrophotographic process interact with one another, and thus parameters for setting operations of these devices cannot be decided independently. Moreover, because an image to be measured has a plurality of colors or a plurality of brightness values/density values, it is necessary to perform "multiple-input and multiple-output control" for simultaneously deciding a plurality of manipulated variables. Here, the "manipulated variables" or "control inputs" in the control system are set values of the charging device, the exposing device, and the developing device, while "controlled variable" or "output" is a color or density/brightness to be measured on a sheet of paper with an image fixed thereon. Furthermore, in addition to the "multiple-input and multiple-output control", an input-output relation in the electrophotographic process is generally complicated, and thus the same output cannot always be obtained with respect to the same input due to operating environments (temperature, humidity, etc.) and an operating time. As explained above, there is a problem that a model of the process also includes uncertain factors.

In order to solve the problems mentioned above, the Document 2 describes such a design method of a controller in which a difference between an output and a target value is caused to approach zero using a "robust control" method and stability is ensured under all cases of assumed uncertainties in operations of the process.

Incidentally, according to the Document 2, there is disclosed a feedback control system in which a relation between control input and gradation capability/color reproducibility of an output image is expressed as "linear model" and the robustness of the control system against non-linearity and uncertainty of the model is ensured. The method disclosed in the Document 2 allows frequent control of the process in real time without stopping the printing operation.

However, there are various constraint conditions for the set values (charging bias, exposing intensity, and developing bias, etc.) of the charging device, the exposing device, and the developing device in the image forming engine using the electrophotographic process. Each of the set values has upper limit/lower limit or strong limitation on a range of values which are caused to vary at a time. Moreover, the set values have mutual constraint. For example, a charging potential needs to fall within a certain range with respect to the developing bias. In addition, the relation among the set values of the charging device; the exposing device, and the developing device or the like; the color finally fixed on the paper; and the density/brightness of the color has high non-linearity.

As explained above, there is a big problem with the method disclosed in the Document 2 that the constraint conditions (upper limit and lower limit, etc.) for the "manipulated variables" or "control inputs" of the set values of the charging device, the exposing device, and the developing device in the image forming engine using the electrophotographic process cannot be considered.

Moreover, the relation between the control inputs and the gradation capability/the color reproducibility of the output image becomes nonlinear. An object being originally "nonlinear system" is approximated to be "linear system" and the "robust control" is applied to the object, and thus, there is also a problem that the object becomes a "conservative" control system with low transient response performance.

The present invention has been achieved to solve the conventional problems, and it is an object of the present invention to provide an image forming apparatus and an image forming method capable of improving the robustness related to the uncertainty of the process model related to image formation.

SUMMARY OF THE INVENTION

It is an object of the present invention to at least partially solve the problems in the conventional technology.

According to an aspect of the present invention, there is provided an image forming apparatus including: an image forming unit that forms an image using an electrophotographic process; a color measuring unit that measures a color of the image; a measured-value acquiring unit that acquires a measured value that is measured by the color measuring unit; and a set-value deciding unit that decides a set value related to formation of the image based on a difference between the measured value and a preset target value, wherein the set-value deciding unit determines the set value so that the image approaches a reference value in a period from a current state of the image to desired state of the image while optimizing a constraint evaluation function related to a constraint condition for the formation of the image by using an estimation equation for approximating time-series variation in a state of the image.

According to another aspect of the present invention, there is provided an image forming method for forming an image using an electrophotographic process, the image forming method including: acquiring a measured value of a color of the image in a measured-value acquiring unit; and deciding a set value related to formation of the image based on a difference between the measured value and a preset target value in a set-value deciding unit, wherein in the set-value deciding unit, the set value is determined so that the image approaches a reference value in a period from a current state of the image to its desired state of the image while optimizing a constraint evaluation function related to a constraint condition for the formation of the image by using an estimation equation for approximating time-series variation in a state of the image at the deciding.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of an image forming apparatus and an image forming method according to the present invention will be explained in detail below with reference to the accompanying drawings.

A first embodiment of the present invention will be explained below with reference to FIG. 1 through FIG. 11. The first embodiment is an example being applied to a color production printer, which is an image forming apparatus, for implementing color-on-demand printing for outputting a large number of color documents such as bills at high speed. The color production printer is used in a case where, for example, tens of millions of telephone bills and receipts are issued within about one week. Thus, continuous printing is performed day and night during the period of one week (in other words, high-speed printing of hundreds of copies per minute is continuously performed for several tens of hours).

Figure 1:
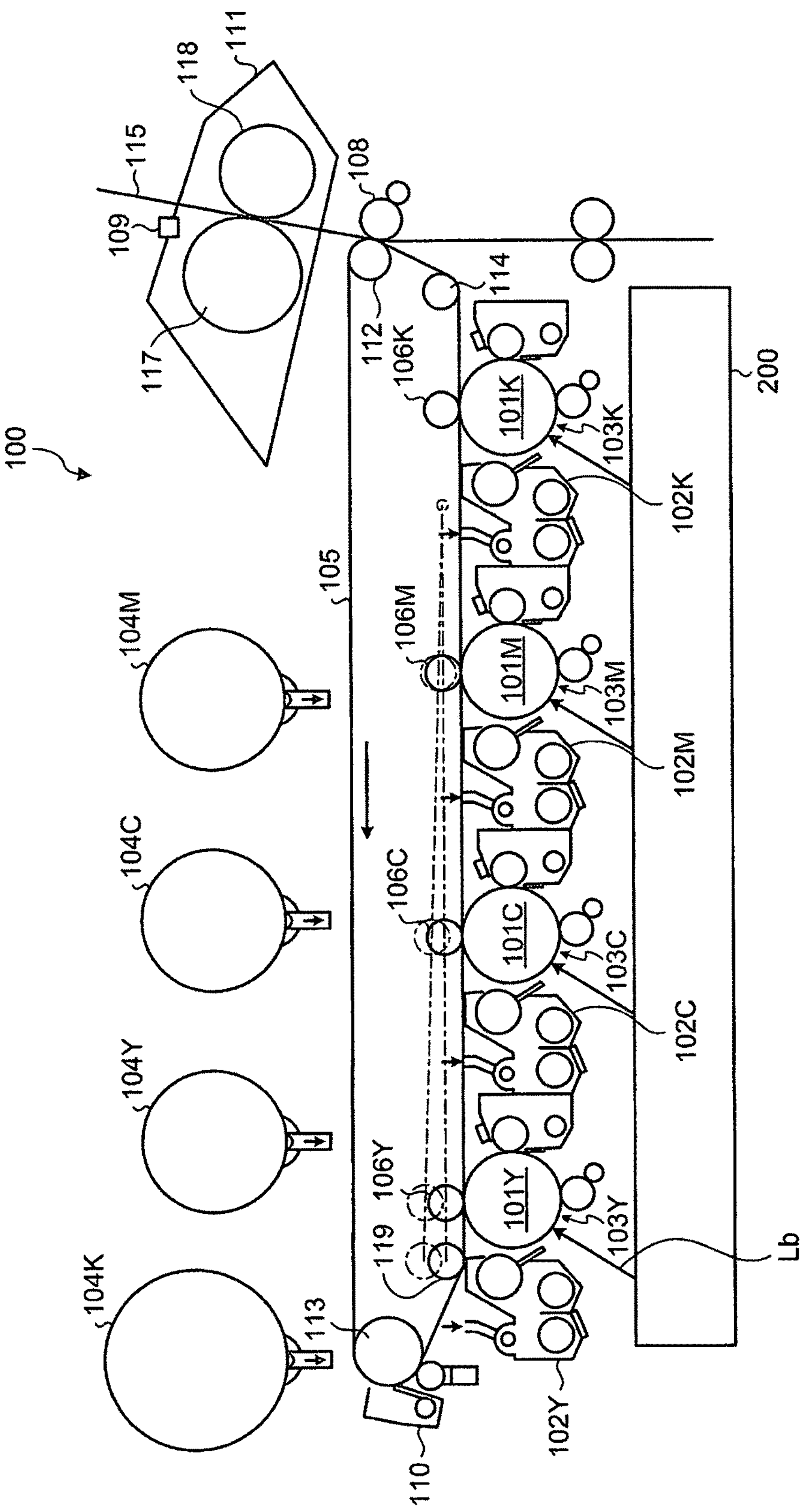
FIG. 1 is a schematic configuration diagram of partially representing a color production printer according to a first embodiment of the present invention.

FIG. 1 is a schematic configuration diagram of partially representing a color production printer 100 according to the first embodiment of the present invention. FIG. 1 represents only an image forming process portion (process engine portion) using electrophotographic processes of exposure, charging, development, transfer, and fixture, of the color production printer (hereinafter, "printer") 100. The printer 100 is provided with, in addition to the components shown in FIG. 1, a paper feed device for feeding transfer paper 115 being a recording material, a manual feed tray for manually feeding the transfer paper 115, and a paper ejection tray to which an image-formed transfer paper 115 is ejected (all of which is not shown).

As shown in FIG. 1, the printer 100 is provided with an endless-belt-shaped intermediate transfer belt 105 being an intermediate transfer body. The intermediate transfer belt 105 is stretched by four support rollers 112, 113, 114, and 119 and is driven to rotate by the support roller 112 having a function as a drive roller.

Arranged along the stretched portion of the intermediate transfer belt 105 are four image forming units 101Y, 101C, 101M, and 101K for colors of yellow (Y), cyan (C), magenta (M), and black (K). The four image forming units 101Y, 101C, 101M, and 101K for the respective colors have the same configuration and are formed of the same components as one another. In FIG. 1, numeral portions of the same components are represented by the same number, and color identifying codes Y (yellow), C (cyan), M (magenta), and K (black) are added to the respective ends of the same number. The image forming units 101Y, 101C, 101M, and 101K have photosensitive drums 103Y, 103C, 103M, and 103K; developing devices 102Y, 102C, 102M, and 102K; and primary transfer devices 106Y, 106C, 106M, and 106K being charging devices that charge the intermediate transfer belt 105, respectively. The developing devices 102Y, 102C, 102M, and 102K are configured so as to be supplied with toner from toner bottles 104K, 104Y, 104C, and 104M, respectively.

Provided below the image forming units 101Y, 101C, 101M, and 101K is an exposing device 200. Write beams Lb are emitted from a laser exposing unit (not shown) provided inside the exposing device 200 based on image information by driving a semiconductor laser, and electrostatic latent images are thereby formed on the photosensitive drums 103Y, 103C, 103M, and 103K being image carriers, respectively. Here, emission of the write beam is not limited to laser, and thus, for example, LED (light emitting diode) may be used.

The configuration of the image forming units 101Y, 101C, 101M, and 101K will be explained below with reference to FIG. 2. Hereinafter, explanation will be made by exemplifying the image forming unit 101K for forming a black toner image with reference to FIG. 2, however, the image forming units 101Y, 101C, and 101M for forming toner images of the other colors have also the same configuration as that of 101K.

Figure 2:
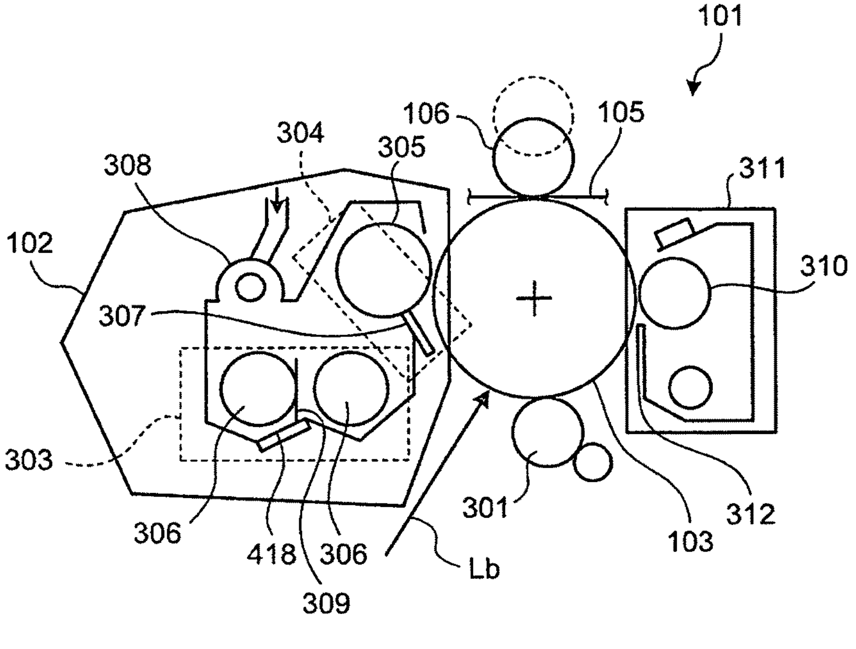
FIG. 2 is a schematic configuration diagram of an image forming unit.

As shown in FIG. 2, the components of the image forming unit 101K for black toner are supposed to be added with the code K to the ends of the numerals, however, the components are represented herein without the code K. Arranged around the photosensitive drum 103 of the image forming unit 101 are a charging device 301 for charging the photosensitive drum 103, the developing device 102, and a photosensitive-element cleaning device 311. The primary transfer device 106 being a charging device is provided at a position opposite to the photosensitive drum 103 via the intermediate transfer belt 105. A primary transfer roller is adopted as the primary transfer device 106, and is provided so as to be pressed against the photosensitive drum 103 via the intermediate transfer belt 105. It should be noted that the primary transfer device 106 is not necessarily a roller-shaped one, and therefore a conductive brush-shaped one or a non-contact corona charger can be adopted.

The charging device 301 is a contact charging system adopting a charging roller. The charging device 301 comes in contact with the photosensitive drum 103 and applies a voltage thereto to thereby uniformly charge the surface of the photosensitive drum 103. The charging device 301 can also adopt a non-contact charging system adopting a non-contact scorotron charger and the like.

The developing device 102 uses a two-component developer composed of magnetic carrier and non-magnetic toner. However, a one-component developer may also be used as the developer. The developing device 102 can be broadly divided into a stirring portion 303 and a developing portion 304 provided in a developing case. In the stirring portion 303, the two-component developer (hereinafter, simply "developer") is conveyed while being stirred and is supplied onto a developing sleeve 305 as a developer carrier.

Two screws 306 are provided in parallel to each other in the stirring portion 303. Provided between these two screws 306 is a partition plate 309 for partitioning the screws so as to mutually communicate each other at both ends of the partition plate. Attached to a developing case 308 that stores the developing sleeve 305 and the two screws 306 or the like is a toner concentration sensor 418 that detects toner concentration in the developer inside the developing device 102. Meanwhile, in the developing portion 304, the toner of the developer deposited to the developing sleeve 305 is transferred to the photosensitive drum 103.

Provided in the developing portion 304 is the developing sleeve 305 opposite to the photosensitive drum 103 through an opening of the developing case, and a magnet (not shown) is fixedly provided in the developing sleeve 305. In addition, a doctor blade 307 is provided so that an edge portion thereof is made close to the developing sleeve 305. In the first embodiment, a space of a closest portion between the doctor blade 307 and the developing sleeve 305 is set so as to be 0.9 millimeter. The developing device 102 is configured to circulate and convey the developer while stirring it with the two screws 306 and supply the developer to the developing sleeve 305. The developer supplied to the developing sleeve 305 is attracted and held by the magnet. The developer attracted to the developing sleeve 305 is conveyed with a rotation of the developing sleeve 305, and is regulated to an appropriate amount by the doctor blade 307. The regulated developer is returned to the stirring portion 303.

The developer conveyed in this manner to a developing area facing the photosensitive drum 103 is caused to enter a state of toner chains by the magnet to form a magnetic brush. Formed in the developing area by the developing bias applied to the developing sleeve 305 is a developing electric field which moves the toner in the developer to an electrostatic latent image portion on the photosensitive drum 103. This allows the toner in the developer to transfer to the electrostatic latent image portion on the photosensitive drum 103, and the electrostatic latent image on the photosensitive drum 103 is thereby visualized and a toner image is formed. The developer having passed through the developing area is conveyed to a portion with weak magnetic force of the magnet, where the developer is separated from the developing sleeve 305 to be returned into the stirring portion 303. When the toner concentration in the stirring portion 303 becomes low due to repetition of such operations as above, the toner concentration sensor 418 detects this condition, and toner is supplied to the stirring portion 303 based on the result of detection.

The photosensitive-element cleaning device 311 is arranged so that the edge of a cleaning blade 312 is pressed against the photosensitive drum 103. The photosensitive-element cleaning device 311 is provided with the cleaning blade 312 made of, for example, polyurethane rubber. In the first embodiment, a conductive fur brush 310 that comes in contact with the photosensitive drum 103 in order to enhance the cleaning performance is used together with the cleaning blade 312. Applied to the fur brush 310 is bias from a metallic electric-field roller (not shown), and the edge of a scraper (not shown) is pressed against the electric-field roller. The toner removed from the photosensitive drum 103 by the cleaning blade 312 and the fur brush 310 is stored inside the photosensitive-element cleaning device 311, and the stored toner is collected by a waste-toner collecting device (not shown).

Here, specific settings of the image forming unit 101 will be explained below. A diameter of the photosensitive drum 103 is 40 millimeters, and the photosensitive drum 103 is driven at a linear velocity of 200 mm/s. Furthermore, a diameter of the developing sleeve 305 is 25 millimeters, and the developing sleeve 305 is driven at a linear velocity of 564 mm/s. A charge amount of the toner in the developer supplied to the developing area is preferably in a range of about −10 to −30 μC/g. A developing gap being a space between the photosensitive drum 103 and the developing sleeve 305 can be set in a range of 0.5 to 0.3 millimeter, and by reducing the value, development efficiency can be improved. A photosensitive layer of the photosensitive drum 103 has a thickness of 30 micrometers, a beam spot diameter of an optical system of the exposing device 200 is 50×60 micrometers, and a light amount of the beam is about 0.47 milliwatt. As one example, the surface of the photosensitive drum 103 is uniformly charged to −700 volts by the charging device 301, and a potential at the electrostatic latent image portion irradiated with the laser by the exposing device 200 becomes −120 volts. Meanwhile, the voltage of the developing bias is set to −470 volts and ensures a developing potential of 350 volts. These process conditions are appropriately changed according to the result of electric potential control.

In the image forming unit 101 as shown in FIG. 2, first, the surface of the image forming unit 101 is uniformly charged by the charging device 301 with a rotation of the photosensitive drum 103. Then, the photosensitive drum 103 is irradiated with a laser write beam Lb from the exposing device 200 based on image information input from a print controller 410 (see FIG. 3) and an electrostatic latent image is formed thereon. Thereafter, the electrostatic latent image on the photosensitive drum 103 is visualized by the developing device 102 and a toner image is formed. The toner image is primarily transferred to the intermediate transfer belt 105 by the primary transfer device 106. Residual toner after transfer remaining on the surface of the photosensitive drum 103 after the primary transfer is performed is removed by the photosensitive-element cleaning device 301, and the photosensitive drum 103 is prepared for next image formation.

Referring back to FIG. 1, a secondary transfer roller 108 as a secondary transfer device is provided at a location opposite to the support roller 112 through the intermediate transfer belt 105. The secondary transfer roller 108 transfers the toner image formed on the intermediate transfer belt 105 using electrostatic force to the transfer paper 115 supplied from the paper feed device or the like. When the toner image on the intermediate transfer belt 105 is to be secondarily transferred to the transfer paper 115, the secondary transfer roller 108 is pressed against a portion of the intermediate transfer belt 105 which is wound around the support roller 112, and the secondary transfer is thereby performed. The secondary transfer roller 108 is not necessarily used as the secondary transfer device, and thus, for example, a transfer belt or a non-contact transfer charger may be used.

As shown in FIG. 1, a fixing device 111 for fixing the toner image transferred to the transfer paper 115 is provided in the downstream side of the secondary transfer roller 108 in a transfer-paper conveying direction. The fixing device 111 is configured to press a pressing roller 118 against a heating roller 117. In addition, as shown in FIG. 1, the fixing device 111 is provided with a spectrometer 109 for measuring color information from the toner image after it is fixed on the transfer paper 115, in the downstream side of the heating roller 117 and of the pressing roller 118 in the transfer-paper conveying direction.

Moreover, as shown in FIG. 1, a belt cleaning device 110 is provided at a location opposite to the support roller 113 through the intermediate transfer belt 105. The belt cleaning device 110 is used to remove residual toner remaining on the intermediate transfer belt 105 after the toner image is transferred from the intermediate transfer belt 105 to the transfer paper 115.

Figure 3:
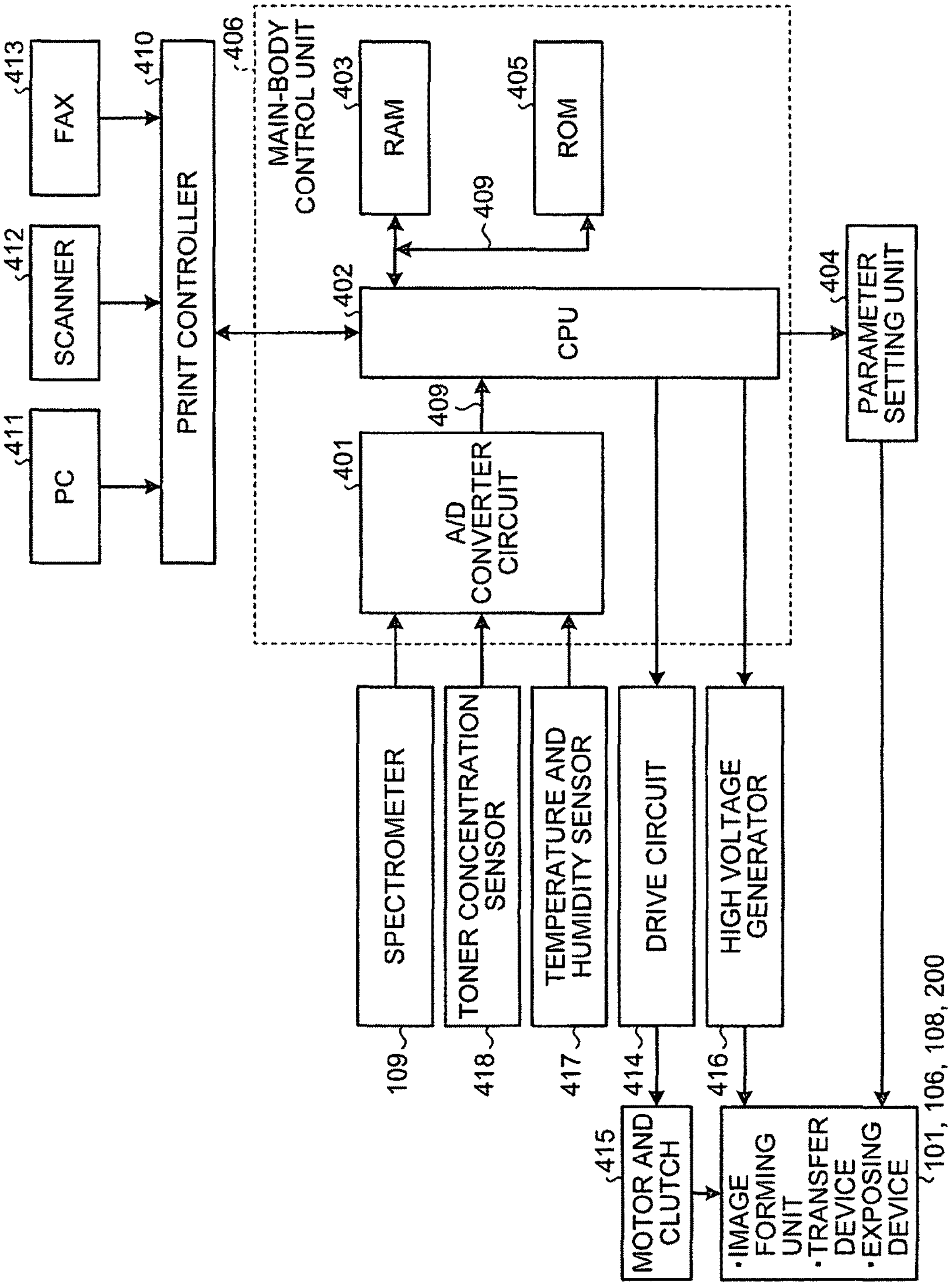
FIG. 3 is a block diagram of electrical connections between components provided in the printer.

Next, electrical connections of the components provided in the printer 100 will be explained below. FIG. 3 is a block diagram of electrical connections between components provided in the printer 100.

As shown in FIG. 3, the printer 100 includes a main-body control unit 406 configured as a computer that functions as an image-formation control unit. The main-body control unit 406 controls drive of the components, and thereby controls image forming operations using an electrophotographic process. The main-body control unit 406 includes a CPU (central processing unit) 402 that executes various computations and drive control of the components, a ROM (read only memory) 405 that previously stores therein fixed data such as computer programs, and a RAM (random access memory) 403 that functions as a work area or the like for storing therein various data so as to be rewritable, the ROM 405 and the RAM 403 being connected to the CPU 402 through a bus line 409. Furthermore, the main-body control unit 406 also includes the spectrometer 109 being a color measuring unit, the toner concentration sensor 418, and an A/D converter circuit 401 that converts information input from a temperature and humidity sensor 417 to digital image data. The A/D converter circuit 401 is connected to the CPU 402 through the bus line 409.

Connected to the main-body control unit 406 is the print controller 410 that processes image data sent from a PC (personal computer) 411, a scanner 412, and a FAX (facsimile) 413 or the like and converts the processed image data to exposure data. Connected also to the main-body control unit 406 is a drive circuit 414 that drives a motor and clutch 415. Further connected to the main-body control unit 406 is a high voltage generator 416 that generates a voltage required for image formation in an image forming portion (the image forming unit 101, the primary transfer device 106, the exposing device 200, and the secondary transfer roller 108, etc.).

Connected also to the main-body control unit 406 is a parameter setting unit 404. The parameter setting unit 404 changes a laser intensity of the exposing device 200, an applied charging voltage for the charging device 301, and a developing bias of the developing device 102 or the like, based on the result calculated by the CPU 402 using the information measured by the spectrometer 109 and the like in order to obtain stable image density.

Here, the operation of the printer 100 will be schematically explained below. When printing is performed by the printer 100 according to the information sent from the PC 411, a printer driver installed in the PC 411 is used so that print information including image data is transmitted from the PC 411.

The print controller 410 receives the print information including the image data transmitted from the PC 411, processes the image data to be converted to exposure data, and outputs a print instruction to the main-body control unit 406. The CPU 402 of the main-body control unit 406 having received the print instruction executes the image-formation control process using the electrophotographic process by following the computer program stored in the ROM 405. More specifically, the CPU 402 of the main-body control unit 406 drives the motor and clutch 415 through the drive circuit 414, so that the support roller 112 is driven to rotate and the intermediate transfer belt 105 is driven to rotate. At the same time, the CPU 402 of the main-body control unit 406 drives the image forming portion (the image forming unit 101, the primary transfer device 106, the exposing device 200, and the secondary transfer roller 108, etc.) using the electrophotographic process through the drive circuit 414, the high voltage generator 416, and the parameter setting unit 404.

The operations of the image forming portion (the image forming unit 101, the primary transfer device 106, the exposing device 200, and the secondary transfer roller 108, etc.) using the electrophotographic process will be explained below. The exposing device 200 irradiates the photosensitive drums 103Y, 103C, 103M, and 103K of the image forming units 101Y, 101C, 101M, and 101K with the write beams Lb respectively based on the image data transmitted from the print controller 410. This irradiation allows formation of electrostatic latent images on the photosensitive drums 103Y, 103C, 103M, and 103K respectively, and the electrostatic latent images are visualized by the developing devices 102Y, 102C, 102M, and 102K respectively. Then, toner images of yellow, cyan, magenta, and black are formed on the photosensitive drums 103Y, 103C, 103M, and 103K respectively. The toner images of the respective colors formed in this manner are primarily transferred sequentially to the intermediate transfer belt 105 by the primary transfer devices 106Y, 106C, 106M, and 106K respectively in a superimposition manner. With these processes, a composite toner image in which the toner images of the respective colors are superimposed on one another is formed on the intermediate transfer belt 105. In addition, the main-body control unit 406 drives the motor and clutch 415 through the drive circuit 414 in synchronization with the timing of conveying the composite toner image formed in the above manner on the intermediate transfer belt 105 to a secondary transfer portion opposed to the secondary transfer roller 108, and controls the paper feed device (not shown) to perform supply of the transfer paper 115. The transfer paper 115 supplied from the paper feed device is fed into between the intermediate transfer belt 105 and the secondary transfer roller 108, where the composite toner image on the intermediate transfer belt 105 is secondarily transferred to the transfer paper 115 by the secondary transfer roller 108. Thereafter, the transfer paper 115 in a state of being attracted to the secondary transfer roller 108 is conveyed up to the fixing device 111 and is applied with heat and pressure by the fixing device 111, so that the fixing process is performed on the toner image. The transfer paper 115 having passed through the fixing device 111 is ejected to a paper ejection tray (not shown) and is stacked thereon. It should be noted that the residual toner after transfer remaining on the intermediate transfer belt 105 after the secondary transfer is performed is removed by the belt cleaning device 110.

Subsequently, a parameter control process in the image-formation control process using the electrophotographic process executed by the CPU 402 of the main-body control unit 406 according to the computer program will be explained in detail below. Here, FIG. 4 is a block diagram of a functional configuration related to the parameter control process, and FIG. 5 is a flowchart of the parameter control process.

Figure 4:
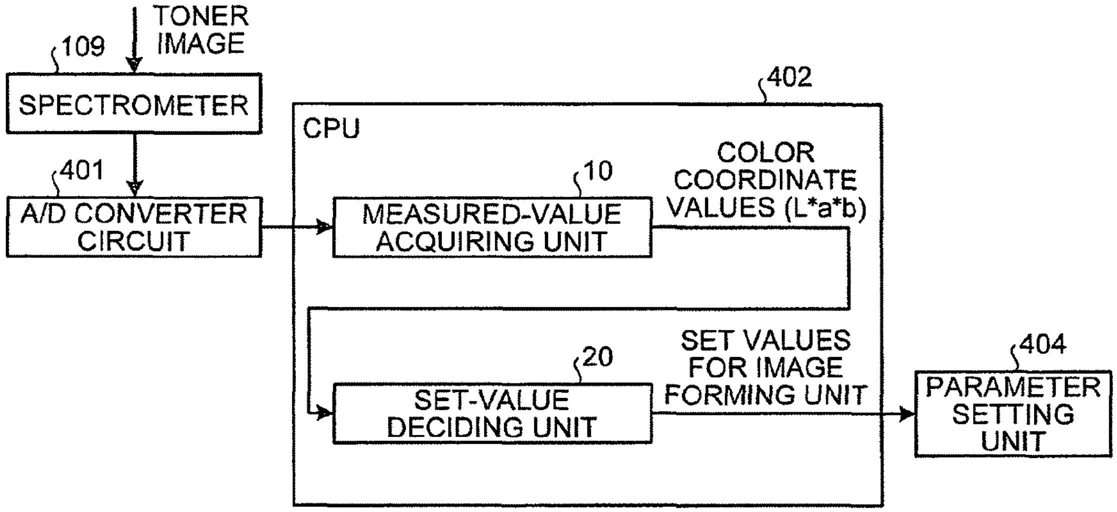
FIG. 4 is a block diagram of a functional configuration related to a parameter control process.
Figure 5:
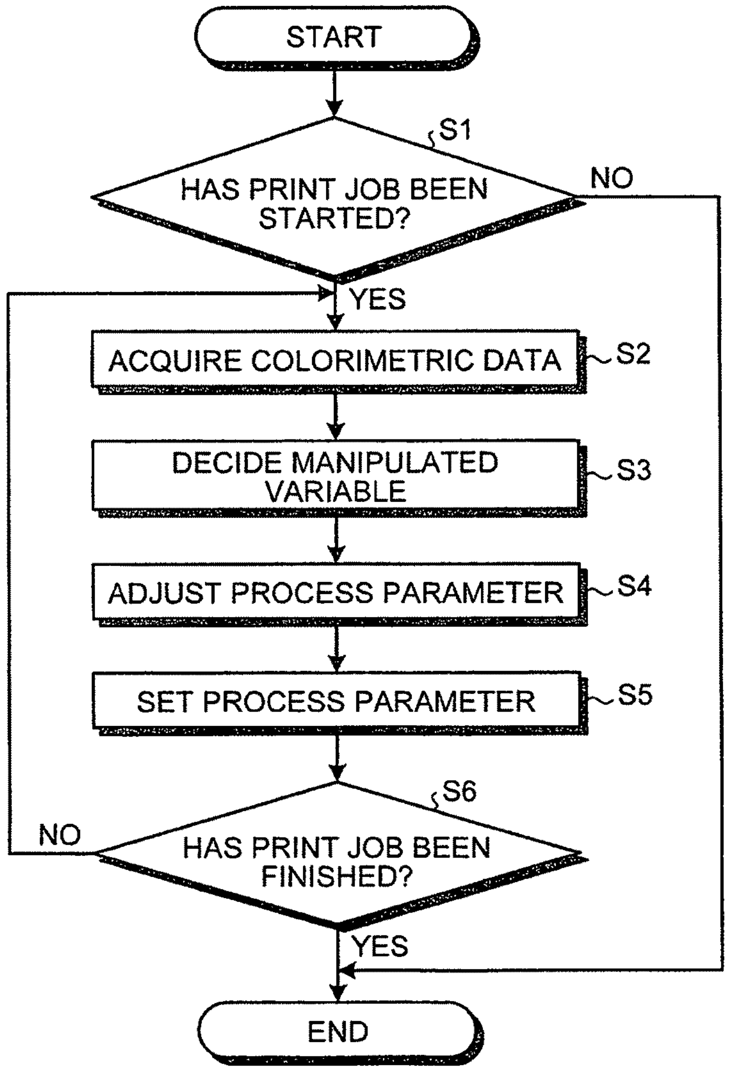
FIG. 5 is a flowchart of the parameter control process.

As shown in FIG. 4, the CPU 402 of the main-body control unit 406 follows the computer program to provide a measured-value acquiring unit 10 and a set-value deciding unit 20.

The measured-value acquiring unit 10 acquires measured values through the spectrometer 109 that measures the colors of the toner images fixed on the transfer paper 115 being a recording material.

The set-value deciding unit 20 feeds back the measured values acquired by the measured-value acquiring unit 10 and decides set values for process parameters related to image formation according to manipulated variables decided based on a difference between the fed-back measured values and preset target values. More specifically, the set-value deciding unit 20 determines a series of manipulated variables so that the toner images approach reference trajectories (reference values) representing ideal time variation from the current state to a desired state while minimizing a constraint evaluation function related to constraint conditions for the manipulated variables using an estimation equation for approximating time-series variation in the state of the toner images through repetition of the feedback control.

As shown in FIG. 5, when a print job is started (Yes at Step S1), the CPU 402 of the main-body control unit 406 acquires color information (colorimetric data) measured from the toner images fixed on the transfer paper 115 through the spectrometer 109 (Step S2: measured-value acquiring unit 10).

Here, for example, digital image data input to the print controller 410 by the PC 411, the scanner 412, or by the FAX 413 is processed to sample some colors. As the process of the digital image, there is applied a color pallet extraction method as described in Japanese Patent Application Laid-open No. 2005-275854. The color pallet is a group of color clusters with top number of component pixels among color clusters obtained by clustering colors of all the pixels of the digital image. A color fixed at a pixel position corresponding to a color of the color pallet is measured by the spectrometer 109, and the measured color input to the CPU 402 is the colorimetric data.

Figure 6:
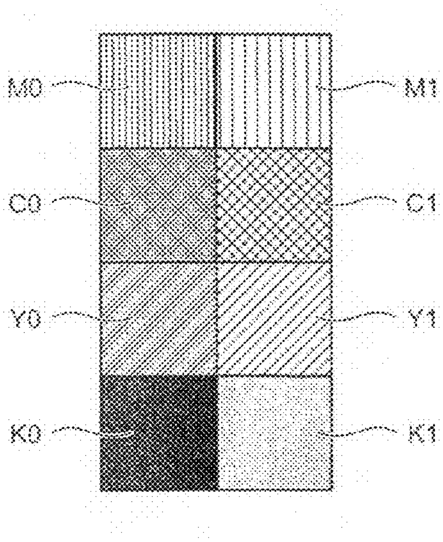
FIG. 6 is a plan view illustrating an example of patch patterns.

Alternatively, an image as patch patterns printed on the transfer paper 115 as shown in FIG. 6 is periodically output and is measured by the spectrometer 109, and the measured image input to the CPU 402 may be used as the colorimetric data.

Subsequently, at Step S3, the CPU 402 compares the colorimetric data acquired at Step S2 with colors of corresponding digital image data using a method explained later, to thereby decide manipulated variables for the process parameters. Here, the manipulated variables for the process parameters are set values of the process parameters related to image formation such as a laser intensity (LDP) of the exposing device 200, an applied charging voltage (Cdc) for the charging device 301, and a developing bias (Vd) of the developing device 102.

Thereafter, the manipulated variables for the process parameters decided at Step S3 are used to decide the process parameters (Step S4), and the process parameters (the laser intensity of the exposing device 200, the applied charging voltage for the charging device 301, and the developing bias of the developing device 102) decided at Step S4 are set in the parameter setting unit 404 (Step S5). Steps S3 to S4 are executed by the set-value deciding unit 20. The process parameters, (the laser intensity of the exposing device 200, the applied charging voltage for the charging device 301, and the developing bias of the developing device 102) that are set in the parameter setting unit 404 in the above manner, are output to the image forming unit 101 (transfer device 106 and the developing device 102) and the exposing device 200 or the like, to be reflected to the processes.

The processes at Steps S2 to S5 as explained above are repeated until the print job is finished or until the output of the specified number of sheets is completed (Yes at Step S6). More specifically, if the output of the specified number of sheets is not completed (No at Step S6), the processes from Steps S2 to S5 are repeated for the toner images fixed on the next transfer paper 115.

When the output of the specified number of sheets is completed (Yes at Step S6), a series of flows is finished herein.

Next, a method of deciding manipulated variables for the process parameters at Step S3 will be explained in detail below.

When the manipulated variables for the process parameters are to be decided, the CPU 402 receives the colorimetric data as an input and the colors on the corresponding digital image data as vector values in, for example, L*a*b* color space. As for eight colors like the patch patterns as shown in FIG. 6, for example, the vector of the colorimetric data and the color vector on the corresponding digital image data are a 24-dimensional vector y(k) in which mean values of L*a*b* measured by using the images of the respective eight colors fixed on the k-th sheet of paper are arranged, and a 24-dimensional vector r0 in which L*a*b* elements on the digital image data are arranged, respectively.

Figure 7:
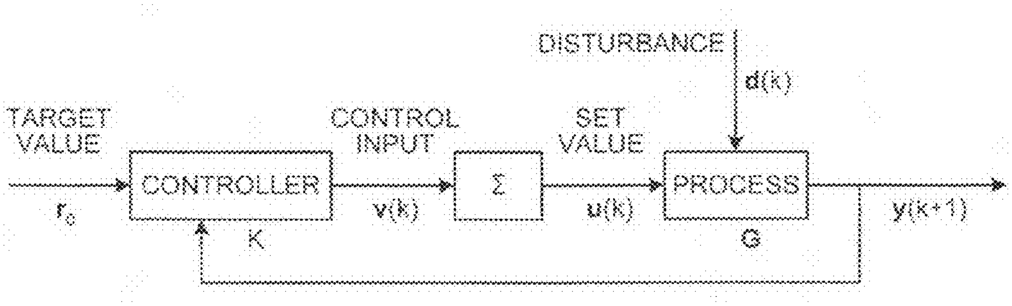
FIG. 7 is a schematic diagram of a structure of a feedback control system related to image formation.

When the manipulated variables for the process parameters are to be decided, the CPU 402 functions as a feedback control system related to image formation as shown in FIG. 7, and a controller K decides a control input v(k) and a parameter set value u(k) for the image forming unit 101 or the like, based on a difference between an output value y(k) measured using the image fixed on the k-th (step k) sheet of paper and the target value r0. A relation between u and y in a steady state is decided as the following equation represented by a multivariate function G, not including time, and is stored in the ROM 405.

$$y=G(u)$$

Figure 8:
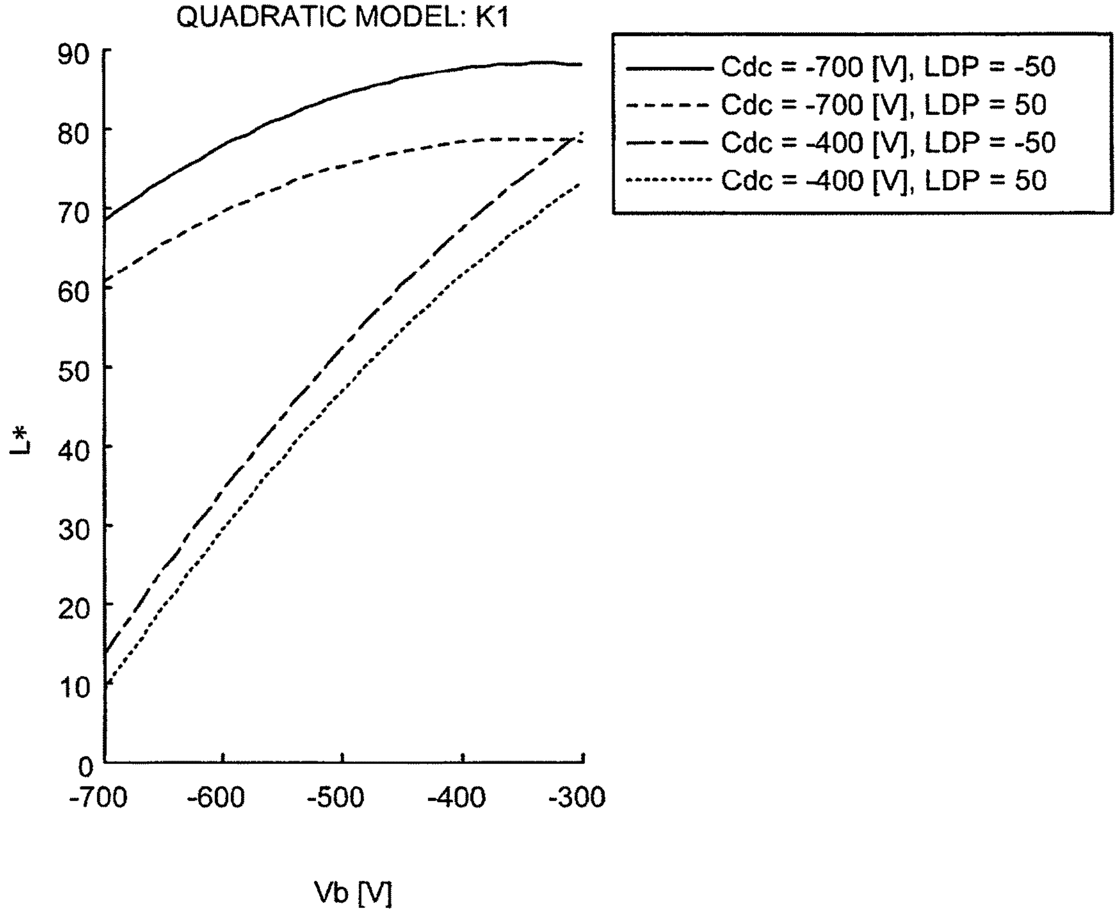
FIG. 8 is a graph representing changes of an L component as a function of process parameters.

Here, a graph shown in FIG. 8 is a graph in which if an L component of "K1" in the patch patterns shown in FIG. 6 is represented by a polynomial function of the laser intensity (LDP) of the exposing device 200, the applied charging voltage (Cdc) for the charging device 301, and the developing bias (Vd) of the developing device 102, then changes of the L component with respect to Vb are plotted when Cdc and LDP are fixed to some values. This graph is expressed by a two-dimensional equation as follows:

$$\begin{aligned} L = {} & 0.00007\cdot Cdc^2 + 0.00033\cdot LDP^2 - 0.00014\cdot Vb^2 + \\ & 0.00011\cdot Cdc\cdot LDP - 0.00005\cdot LDP\cdot Vb + 0.00039\cdot Vb\cdot Cdc + \\ & 0.173\cdot Cdc^2 - 0.315\cdot LDP^2 + 0.172\cdot Vb^2 + 151.12 \end{aligned}$$

A relation between the process parameter u(k) and an image factor y(k) related to image formation at step k (k-th sheet of paper) can be described as following Equation (1) where an output initial value y(1) is an output with respect to a nominal set value u(0), using Taylor expansion of the multivariate function G.

$$y(k+1) = y(k) + \left.\frac{\partial G}{\partial u}\right|_{u(k-1)} (u(k) - u(k-1)) \tag{1}$$

Here, the controller K decides not the process parameter u(k) itself but a difference v(k) thereof, and then it can be described as following Equation (2).

$$u(k)=u(k-1)+v(k) \tag{2}$$

Moreover, as shown in the following Equation (3), a matrix representing changes of an output with respect to changes of the process parameter u(k) is defined as a Jacobian matrix at each step k.

$$B(k) = \left.\frac{\partial G}{\partial u}\right|_{u(k-1)} \tag{3}$$

However, because the multivariate function G is generally non-linear, the matrix B(k) changes at each step. Therefore, the system represented by the Equation (1) can be described by state equation (4) as follows as a linear time-varying system where x is a state variable and d is disturbance.

$$x(k+1)=Ax(k)+B(k)v(k)+d(k),\ A=I$$

$$y(k)=Cx(k),\ C=I \tag{4}$$

Particularly, the matrix B(k) is dependent on the process parameter u at time k−1, and thus it can be described as the following Equation.

$$B(k)=B(u(k-1))$$

This is a system called LPV (Linear Parameter Varying). At each step k, the matrix B(k) changes at each time according to a previous parameter set value u(k−1). By thus doing, the control in the system with high non-linearity in the image forming process can be effectively performed.

As shown in FIG. 7, at step k, the controller K decides a control input v(k) from output value y(k) and the target value r0. The control input v(k) is added to u(k−1) by using the Equation (2), and a process parameter is set to u(k). A value obtained by adding the disturbance d to an output from the process as a result of the setting becomes an output at step k+1.

Modeling of the system is to determine the matrix B(k) or variation of an output with respect to variation of the process parameter. For example, as shown in the patch patterns shown in FIG. 6, if each of the patch patterns is structured as monochrome, the matrix B(k) has a block diagonal structure as shown in the following Equation (5).

$$y(k+1) = y(k) + \begin{pmatrix} B^{M0}(k) & & & & & & & 0 \\ M^{M1}(k) & & & & & & & \\ & B^{C0}(k) & & & & & & \\ & B^{C1}(k) & & & & & & \\ & & B^{Y0}(k) & & & & & \\ & & B^{Y1}(k) & & & & & \\ & & & B^{K0}(k) & & & & \\ 0 & & & B^{K1}(k) & & & & \end{pmatrix} v(k) + d(k) \tag{5}$$

Therefore, as shown in the followings, respective systems for CMYK can be independently considered.

$$y^M(k+1) = y^M(k) + \begin{pmatrix} B^{M0}(k) \\ B^{M1}(k) \end{pmatrix} v^M(k),$$

$$y^C(k+1) = y^C(k) + \begin{pmatrix} B^{C0}(k) \\ B^{C1}(k) \end{pmatrix} v^C(k)$$

$$y^Y(k+1) = y^Y(k) + \begin{pmatrix} B^{Y0}(k) \\ B^{Y1}(k) \end{pmatrix} v^Y(k),$$

$$y^K(k+1) = y^K(k) + \begin{pmatrix} B^{K0}(k) \\ B^{K1}(k) \end{pmatrix} v^K(k)$$

$$y^M = (L^{M0} a^{M0} b^{M0} L^{M1} a^{M1} b^{M1})^T,\ u^M = (Cdc^M\ LDP^M\ Vb^M)^T,$$
$$y^C = (L^{C0} a^{C0} b^{C0} a^{C1} Y^{C1} b^{C1})^T,\ u^C = (Cdc^C\ LDP^C\ Vb^C)^T,$$
$$y^Y = (L^{Y0} a^{Y0} b^{Y0} a^{Y1} Y^{Y1} b^{Y1})^T,\ u^Y = (Cdc^Y\ LDP^Y\ Vb^Y)^T,$$
$$y^K = (L^{K0} a^{K0} b^{K0} a^{K1} Y^{K1} b^{K1})^T,\ u^K = (Cdc^K\ LDP^K\ Vb^K)^T$$

Values of L, a, b, like L shown in FIG. 8, are given as shown in the following Equation (6) as functions of the laser intensity (LDP) of the exposing device 200, the applied charging voltage (Cdc) for the charging device 301, and the developing bias (Vd) of the developing device 102.

$$\begin{cases} L = L(Cdc, LDP, Vb) \\ a = a(Cdc, LDP, Vb) \\ b = b(Cdc, LDP, Vb) \end{cases} \tag{6}$$

As explained above, when L, a, b are expressed by a polynomial equation of Cdc, LDP, and Vb, then B*(k) can be described as a 3×3 matrix shown in the following Equation (7).

$$B*(k) = \begin{pmatrix} \frac{\partial L}{\partial Cdc} & \frac{\partial L}{\partial LDP} & \frac{\partial L}{\partial Vb} \\ \frac{\partial a}{\partial Cdc} & \frac{\partial a}{\partial LDP} & \frac{\partial a}{\partial Vb} \\ \frac{\partial b}{\partial Cdc} & \frac{\partial b}{\partial LDP} & \frac{\partial b}{\partial Vb} \end{pmatrix}_{(Cdc(k),LDP(k),Vb(k))} \tag{7}$$

However, in the case of the pallet (gray of three colors of CMY, red/blue/green, etc.) formed from general color mixture, L, a, b are expressed as shown in the following Equation (8), so that they do not have the block diagonal structure.

$$\begin{cases} L = L(Cdc^M, LDP^M, Vb^M, Cdc^C, LDP^C, Vb^C, \\ \quad Cdc^Y, LDP^Y, Vb^Y, Cdc^K, LDP^K, Vb^K) \\ a = a(Cdc^M, LDP^M, Vb^M, Cdc^C, LDP^C, Vb^C, \\ \quad Cdc^Y, LDP^Y, Vb^Y, Cdc^K, LDP^K, Vb^K) \\ b = b(Cdc^M, LDP^M, Vb^M, Cdc^C, LDP^C, Vb^C, \\ \quad Cdc^Y, LDP^Y, Vb^Y, Cdc^K, LDP^K, Vb^K) \end{cases} \tag{8}$$

Here, a design method of the controller K at step k as shown in FIG. 7 will be studied. The controller K needs to decide a control input v from the output value y and the target value r0 so as to satisfy the following conditions.

(1) A difference between an output and the target value at a next step k+1:

$$\|y(k+1)-r0\| = \|y(k)+B(k)v(k)-r0\|$$

is reduced.

(2) The way to change the control input v can be adjusted. More specifically, a scale factor of each element and a movability of a different target value for each process/module have to be considered into. Moreover, because a model G of the process includes an uncertainty factor, excessive variation of the control input v is not desirable, and it is therefore necessary that maintainability and operability can be controlled.

(3) Constraint conditions for the control input v can be considered. It is necessary that an upper limit and a lower limit or the like can be considered.

The control input v is decided by solving a quadratic programming problem that minimizes the following Equation (9) which puts these three conditions together and takes therein a term representing "adaptation" as indicated in the condition of (1), a term causing the value of the evaluation function to increase as the variation v(k) of the process parameter is increased as indicated in the condition of (2), and further the constraint conditions as indicated in (3).

$$J(v(k)) = (y(k) + B(k)v(k) - r_0)^t R(y(k) + B(k)v(k) - r_0) + v(k)^t Qv(k) \tag{9}$$
$$\text{subject to } Av(k) \geq b$$

Hear, R and Q are positive-definite symmetric matrices, R is weight assigned to each error of the elements, and Q is weight assigned to each factor corresponding to the condition (2). In other words, R is a scale factor of the controlled variable and Q is a scale factor of the control input (manipulated variable). Furthermore, the matrix A and the vector b correspond to the constraint conditions of (3) just above mentioned.

In the first embodiment, the way of thinking, as explained above, is extended so as to decide the control input v in such a manner that behavior of the control system is optimized at not the immediate step k+1 but for a longer period. The control provided by the CPU 402 in the above-mentioned manner is called "model predictive control". The "model predictive control" will be explained in detail below.

Figure 9:
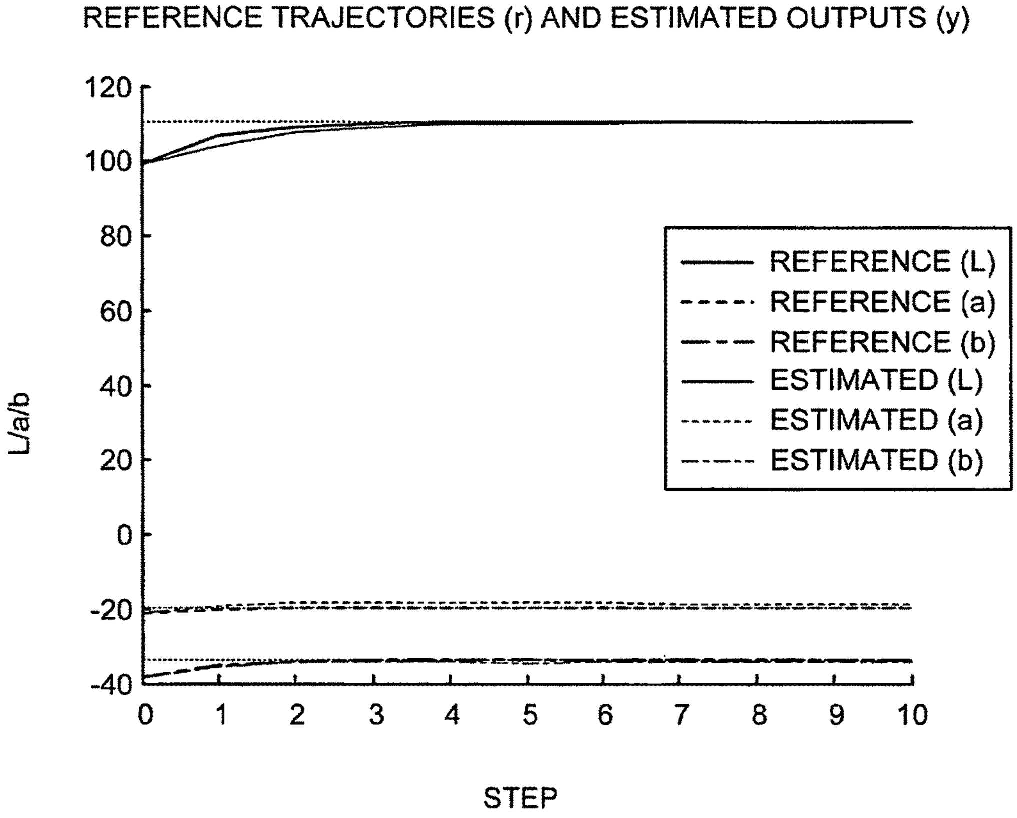
FIG. 9 is a graph representing examples of reference trajectories and calculated control inputs.

As shown in FIG. 9, the CPU 402 decides "reference trajectories" (r[k+1|k], r[k+2|k], . . . , r[k+p|k]) that define estimated outputs (k+1, k+2, . . . , k+p) until after step p, and determines a series of the control inputs (v[k|k], v[k+1|k], . . . , v[k+p−1|k]) so that output series (y[k+1|k], y[k+2|k], . . . , y[k+p|k]) may approach the "reference trajectories" using the Equation (9). At this time, an optimal decision is made in consideration of an increase of a value of the evaluation function with respect to the excessive change of the control input v and the constraint conditions. More specifically, an estimation equation of a future output y at steps k+1, k+2, . . . and a constraint evaluation function to decide the control input v are required. It should be noted that FIG. 9 represents one patch among the patch patterns shown in FIG. 6 or one color.

First, an estimation equation for a future output y at steps k+1, k+2, . . . will be explained below.

If an estimated value of j step ahead at step k is represented as [k+j|k] and an actual value is represented as (k) (e.g., y(k), v(k)), then the estimation equation is give by the following Equation (10).

$$y[k+j\mid k]=y[k\mid k-1]+\sum_{i=1}^{j}B(k)v[k+i-1\mid k]+d[k+j\mid k], \tag{10}$$

$$j=1,2,\ldots$$

Here, there is a value of output disturbance with respect to the disturbance d. More specifically, assuming that $$d[k+j|k]=d[k|k]$$

then the estimated value is represented as a difference between a measured output and an estimated output at time k:

$$d[k|k]=y(k)-y[k|k-1]$$

Therefore, the estimation equation can be described as following Equation (11).

$$y[k+j\mid k]=y(k)+\sum_{i=1}^{j}B(k)v[k+i-1\mid k] \tag{11}$$

Next, constraint evaluation function for deciding the control input v will be explained below.

The constraint evaluation function at step k can be described by following Equation (12) where p is a length of an estimated horizon, r is a reference trajectory, and Q and R are weight matrices (positive-definite symmetric matrices).

$$J(k)=\sum_{j=1}^{p}(y[k+j\mid k]-r[k+j\mid k])^{t}Q_j(y[k+j\mid k]-r[k+j\mid k])+\sum_{j=1}^{p}v[k+j-1\mid k]^{t}R_jv[k+j-1\mid k] \tag{12}$$

subject to $$\begin{cases} v_{min}\le v[k+l-1\mid k]\le v_{max} \\ u_{min}\le u_{k-1}+\sum_{j=1}^{l}v[k+j-1\mid k]\le u_{max} \quad (l=1,2,\ldots,p)\end{cases}$$

In the Equation (12), v_min, v_max, u_min, and u_max are ranges of v and u in FIG. 7 respectively. The reference trajectory r can be provided as, for example, following Equation (13).

$$r[k+j|k]=r_0-\lambda^j(r_0-y(k))(0\leqq\lambda<1) \tag{13}$$

The controller K calculates an optimal control input series (v[k|k], v[k+1|k], . . . , v[k+p−1|k]) so as to minimize the constraint evaluation function using the estimation equation. The first element v[k|k] is used as v(k), and the process parameter at step k is updated by following equation shown below.

$$u(k)=u(k-1)+v(k)$$

It should be noted that the calculation of the optimal control input series can be solved as the "quadratic programming problem". Formulation as the quadratic programming problem" will be explained below.

The estimation equation represented as the Equation (11) can be rewritten as following Equation (14).

$$\begin{pmatrix} y[k+1\mid k] \\ \vdots \\ y[k+p\mid k]\end{pmatrix}=\begin{pmatrix} I \\ \vdots \\ I\end{pmatrix}y(k)+\begin{pmatrix} B(k) & O & O \\ \vdots & \ddots & O \\ B(k) & \ldots & B(k)\end{pmatrix}\begin{pmatrix} v[k\mid k] \\ \vdots \\ v[k+p-1\mid k]\end{pmatrix} \tag{14}$$

Here, if $$Y_k\equiv\begin{pmatrix} y[k+1\mid k] \\ \vdots \\ y[k+p\mid k]\end{pmatrix},\ V_k\equiv\begin{pmatrix} v[k\mid k] \\ \vdots \\ v[k+p-1\mid k]\end{pmatrix},$$

$$\Theta_k\equiv\begin{pmatrix} B(k) & O & O \\ \vdots & \ddots & O \\ B(k) & \ldots & B(k)\end{pmatrix},\ \Omega_k\equiv\begin{pmatrix} r[k+1\mid k] \\ \vdots \\ r[k+p\mid k]\end{pmatrix},\ \Psi\equiv\begin{pmatrix} I \\ \vdots \\ I\end{pmatrix}$$

then, it can be represented as follows:

$$Y_k=\Psi y_k+\Theta_kV_k$$

Furthermore, allowing for a scale factor of each manipulated variable, if $$Q\equiv\begin{pmatrix} Q_1 & O & O \\ O & \ddots & O \\ O & O & Q_p\end{pmatrix},\ R\equiv\begin{pmatrix} R_1 & O & O \\ O & \ddots & O \\ O & O & R_p\end{pmatrix}$$

then, the constraint evaluation function is described as following Equation (15).

$$\begin{aligned} J(k)&=(Y_k-\Omega_k)^TQ(Y_k-\Omega_k)+V_k^TRV_k \\ &=(\Psi y_k+\Theta_kV_k-\Omega_k)^TQ(\Psi y_k+\Theta_kV_k-\Omega_k)+V_k^TRV_k \\ &=2\left\{\frac{1}{2}V_k^T(\Theta_k^TQ\Theta_k+R)V_k+(\Psi y_k-\Omega_k)^TQ\Theta_kV_k\right\}+const.\end{aligned} \tag{15}$$

Furthermore, if the following constraint conditions $$\begin{cases} v_{min}\le v[k+l-1\mid k]\le v_{max} \\ u_{min}\le u(k-1)+\sum_{j=1}^{l}v[k+j-1\mid k]\le u_{max} \quad (l=1,2,\ldots,p)\end{cases}$$

are represented as follows using appropriate matrices $C_k$ and b, $$C_k=\begin{pmatrix} I & & O \\ \vdots & \ddots & \\ O & \ldots & I \\ \hline -I & & O \\ \vdots & \ddots & \\ O & \ldots & -I \\ \hline I & & O \\ \vdots & \ddots & \\ I & \ldots & I \\ \hline -I & & O \\ \vdots & \ddots & \\ -I & \ldots & -I\end{pmatrix},\ b=\begin{pmatrix} v_{max} \\ \vdots \\ v_{max} \\ -v_{min} \\ \vdots \\ -v_{min} \\ u_{max}-u_{k-1} \\ \vdots \\ u_{max}-u_{k-1} \\ u_{k-1}-u_{min} \\ \vdots \\ u_{k-1}-u_{min}\end{pmatrix}$$

then, the model predictive control can be formulated, as shown in following Equation (16), as a problem for solving the quadratic programming problem on an optimal manipulated variable series $V_k$ at each step k, so that the image-forming process condition can be efficiently decided.

$$\min_{V_k}\left\{\frac{1}{2}V_k^T(\Theta_k^T Q\Theta_k + R)V_k + (\Psi y_k - \Omega_k)^T Q\Theta_k V_k\right\} \quad (16)$$

$$\text{subject to } C_k V_k \le b$$

It should be noted that an efficient algorithm such as an interior-point method (or, interior method) can be used for the solution of the problem of Equation (16).

The above is the explanation about the way to decide the manipulated variable for the process parameter at Step S3.

Upon decision of a process parameter at Step S4 using the manipulated variable for the process parameter decided at Step S3, in a vector obtained as a solution as shown below:

$$\begin{pmatrix} v[k\mid k] \\ \vdots \\ v[k+p-1\mid k] \end{pmatrix}$$

v[k|k] is used as v(k) to update the process parameter at step k as the following equation.

$$u(k)=u(k-1)+v(k)$$

A measured value of an output after u(k) is input as a set value of the process parameter is y(k+1).

Figure 10:
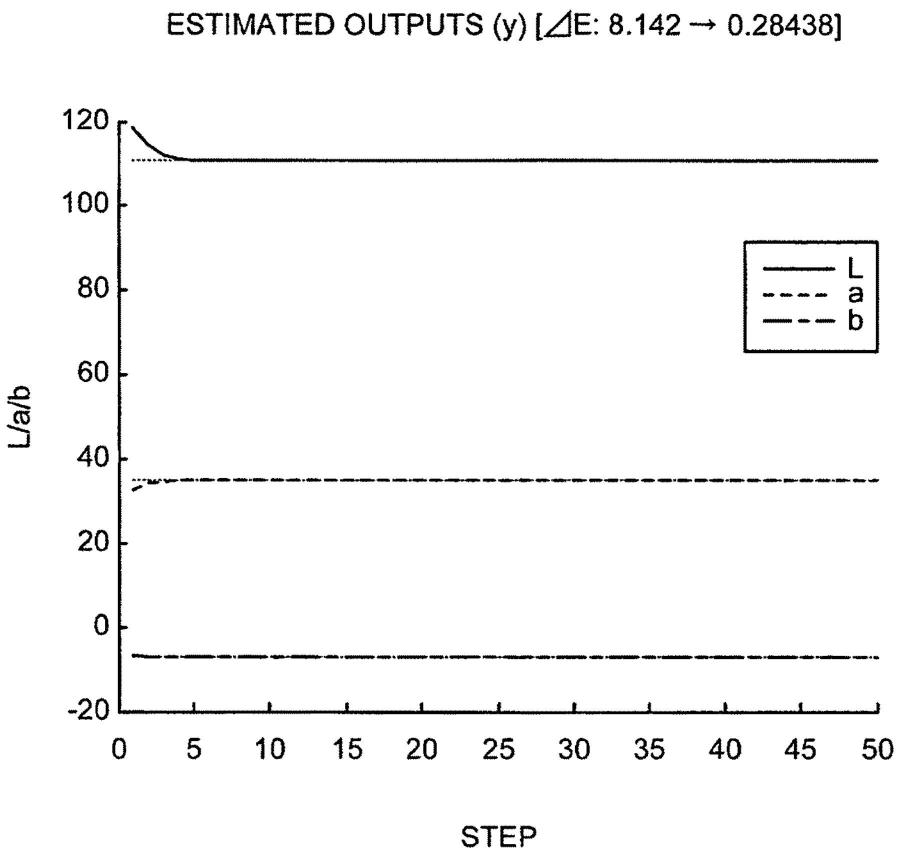
FIG. 10 is a graph representing changes of outputs due to feedback control.

Here, an example of how an output value y(k) changes, when the processes as shown in FIG. 5 are applied, is represented in FIG. 10. Here, the horizontal-axis of the graph in FIG. 10 represents an output paper number, or represents the number of feedbacks when feedback control is provided for not all the sheets of paper but for each several sheets of paper. The vertical-axis of the graph in FIG. 10 represents each coordinate value in the L*a*b* color space, and dotted lines are target values on respective coordinates. As explained above, there is a difference of ΔE=8.1 between the target value and the output color on the first sheet, however, the output y follows the target value through real-time feedback control without stopping the printing operation.

Figure 11:
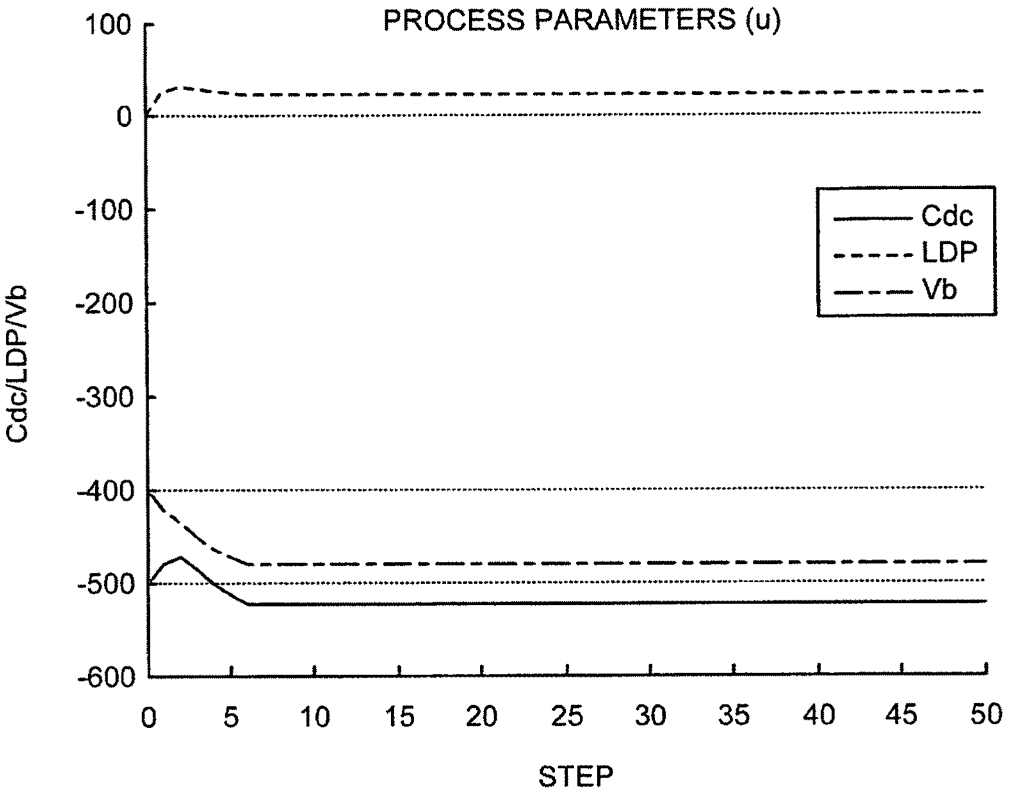
FIG. 11 is a graph representing changes of the process parameters due to the feedback control.

An example of how the process parameter u(k) changes, when the processes as shown in FIG. 5 are applied, is shown in FIG. 11. The horizontal-axis of the graph in FIG. 11 is the same as that in FIG. 10, and represents an output paper number, or represents the number of feedbacks when feedback control is provided for not all the sheets of paper but for each several sheets of paper. The vertical-axis of the graph in FIG. 11 represents the laser intensity (LDP) of the exposing device 200, the applied charging voltage (Cdc) for the charging device 301, and the developing bias (Vd) of the developing device 102. In this manner, the process parameters are converged to optimal values through real-time feedback control without stopping the printing operation.

As explained above, according to the first embodiment, while minimizing the constraint evaluation function related to the constraint conditions for the manipulated variable using the estimation equation for approximating time-series variation in the state of the toner images through repetition of the feedback control, a series of the manipulated variables is determined so that the toner images approach the reference trajectories representing an ideal time variation from the current state of the toner images to a desired state thereof, so that the change of a future state of the toner images is estimated and the set values of the process parameters related to the image formation can thereby be optimally set, thus improving the robustness with respect to the uncertainty of the process model related to the image formation.

It should be noted that in the first embodiment, color information is measured from the toner images fixed on the transfer paper 115 by the spectrometer 109, however, the measurement is not limited thereto. Thus, the color information can be measured from the toner images on the intermediate transfer belt 105.

Next, a second embodiment of the present invention will be explained below with reference to FIG. 12 through FIG. 18. It should be noted that the same portions as these of the first embodiment are indicated by the same numerals and explanation thereof is also omitted.

Figure 12:
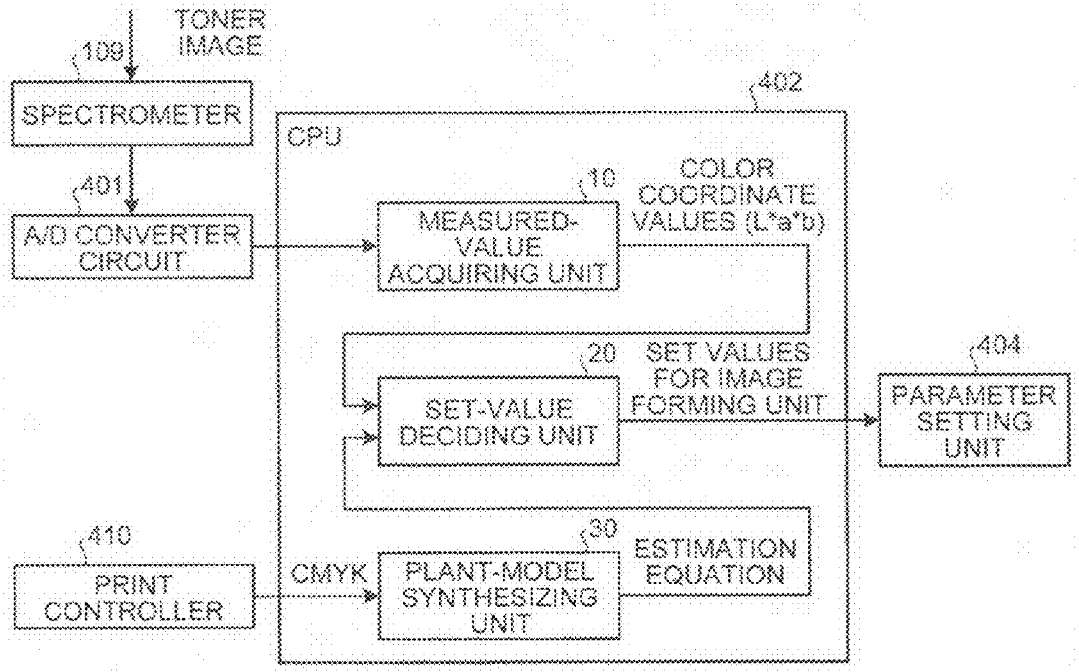
FIG. 12 is a block diagram of a functional configuration related to a parameter control process according to a second embodiment of the present invention.

There is explained, with reference to the block diagram shown in FIG. 12, a parameter control process in the image-formation control process using the electrophotographic process executed by the CPU 402 of the main-body control unit 406 in the printer 100 of the second embodiment according to a computer program.

As shown in FIG. 12, the CPU 402 of the main-body control unit 406 implements the measured-value acquiring unit 10, the set-value deciding unit 20, and a plant-model synthesizing unit 30 by following the computer program.

The measured-value acquiring unit 10 acquires a measured value through the spectrometer 109 that measures colors of the toner images fixed on the transfer paper 115 being a recording material.

The set-value deciding unit 20 feeds back the measured value acquired by the measured-value acquiring unit 10 and decides a set value for the process parameter related to the image formation according to the manipulated variable decided based on a difference between the fed-back measured value and the preset target value. More specifically, the set-value deciding unit 20 minimizes the constraint evaluation function related to the constraint conditions for the manipulated variable using an estimation equation which is constructed by the plant-model synthesizing unit 30 and approximates time-series variation in the state of the toner images through repetition of the feedback control, and determines a series of the manipulated variables so that the toner images approach the reference trajectories representing an ideal time variation during from the current state of the toner images to a desired state thereof.

The plant-model synthesizing unit 30 synthesizes an estimation equation for an arbitrary color from the set value of a current image forming unit and the color of a toner image to be measured by the spectrometer 109 for solid densities of primary colors previously calculated and stored in the ROM 405, using a mathematical formula (estimation equation) for estimating a next measured value. More specifically, if four image forming units are formed from cyan (C), magenta (M), yellow (Y), and black (k), estimation equations (total of four) of primary colors with four solid densities to be separately output from the respective units are stored in the ROM 405. A toner image of an arbitrary color is synthesized from a plurality of primary colors according to each area ratio of the primary colors calculated by the print controller. By combining the estimation equations for the primary colors using the calculated area ratios, the estimation equation for the toner image of the arbitrary color is synthesized.

As shown in FIG. 5, when a print job starts (Yes at Step S1), the CPU 402 of the main-body control unit 406 acquires color information (colorimetric data) measured from the toner images fixed on the transfer paper 115 through the spectrometer 109 (Step S2: measured-value acquiring unit 10).

Here, for example, digital image data input to the print controller 410 by the PC 411, the scanner 412, or the FAX 413 is processed to sample some colors. As the process of the digital image, there is applied a color pallet extraction method as described in Japanese Patent Application Laid-open No. 2005-275854. The color pallet is a group of color clusters with top number of component pixels among color clusters obtained by clustering colors of all the pixels of the digital image. A color fixed at a pixel position corresponding to a color of the color pallet is measured by the spectrometer 109, and the measured color input to the CPU 402 is the colorimetric data.

Figure 13:
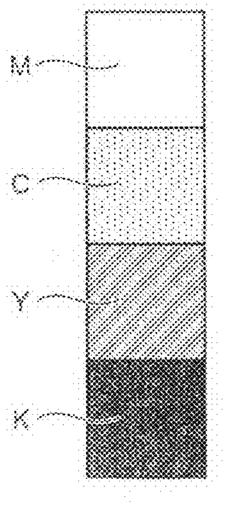
FIG. 13 is a plan view illustrating an example of patch patterns.

Alternatively, an image as patch patterns as shown in FIG. 13 printed on the transfer paper 115 is periodically output and is measured by the spectrometer 109, and the measured image that is input to the CPU 402 may be used as the colorimetric data.

Subsequently, at Step S3, the CPU 402 compares the colorimetric data acquired at Step S2 with colors of corresponding digital image data using a method explained later, so as to thereby decide manipulated variables for the process parameters. Here, the manipulated variables for the process parameters are set values of the process parameters related to image formation such as the laser intensity (LDP) of the exposing device 200, the applied charging voltage (Cdc) for the charging device 301, and the developing bias (Vd) of the developing device 102.

Thereafter, the manipulated variables for the process parameters decided at Step S3 are used to decide the process parameters (Step S4), and the process parameters (the laser intensity of the exposing device 200, the applied charging voltage for the charging device 301, and the developing bias of the developing device 102) decided at Step S4 are set in the parameter setting unit 404 (Step S5). Steps S3 to S4 are executed by the set-value deciding unit 20. The process parameters (the laser intensity of the exposing device 200, the applied charging voltage for the charging device 301, and the developing bias of the developing device 102) set in the parameter setting unit 404 in the above manner are output to the image forming unit 101 (transfer device 106 and the developing device 102) and the exposing device 200 or the like, to be reflected to the processes.

The processes at Steps S2 to S5 as explained above are repeated until the print job is finished or until the output of the specified number of sheets is completed (Yes at Step S6). More specifically, if the output of the specified number of sheets is not completed (No at Step S6), the processes from Steps S2 to S5 are repeated for toner images fixed on the next transfer paper 115.

When the output of the specified number of sheets is completed (Yes at Step S6), a series of flows is finished herein.

Next, a method of deciding manipulated variables for the process parameters at Step S3 will be explained in detail below.

When the manipulated variables for the process parameters are to be decided, the CPU 402 receives the colorimetric data as an input and the colors on the corresponding digital image data as vector values in, for example, the L*a*b* color space. As for four colors like the patch patterns as shown in FIG. 13, for example, each vector of the colorimetric data and the color vector on the corresponding digital image data is defined as a 12-dimensional vector y(k) in which mean values of L*a*b*, measured by using the images of the eight colors fixed on the k-th sheet of paper, are arranged and a 12-dimensional vector r0 in which L*a*b* elements on the digital image data are arranged, respectively.

When the manipulated variables for the process parameters are to be decided, the CPU 402 functions as the feedback control system related to the image formation as shown in FIG. 7, and the controller K decides the control input v(k) and the parameter set value u(k) for the image forming unit 101 or the like, based on a difference between the output value y(k) measured using the images fixed on the k-th (step k) sheet of paper and the target value r0. A relation between u and y is defined as the following equation represented by the multivariate function G, not including time, and is stored in the ROM 405.

$$y=G(u)$$

More specifically, if four image forming units are formed for cyan (C), magenta (M), yellow (Y), and black (k), then models G (total of four) are stored in the ROM 405, the model G representing, as a mathematical formula, a relation between a set value u and output colors u and y of the image forming unit for each of the four primary colors with solid densities which are separately output from the respective units.

Figure 14:
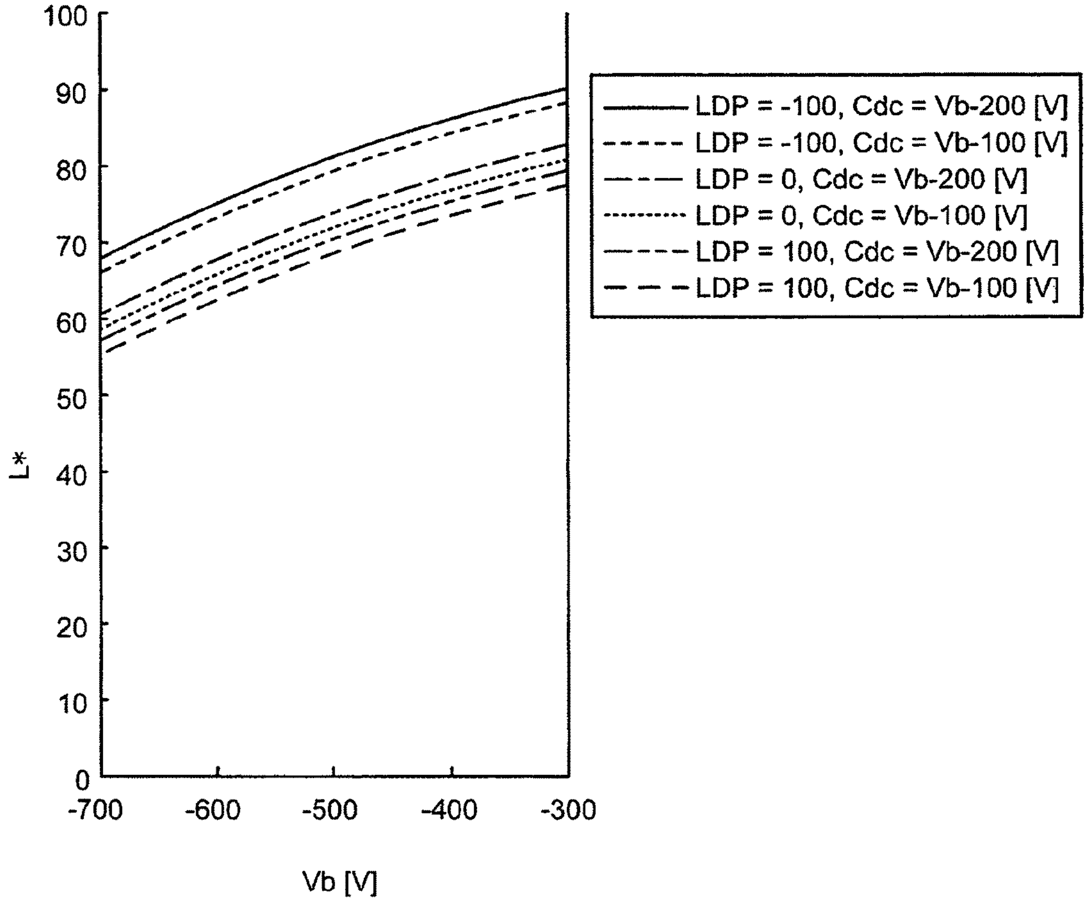
FIG. 14 is a graph representing changes of an L component as a function of process parameters.

Here, the graph shown in FIG. 14 is a graph in which if an L component of "C" in the patch patterns shown in FIG. 13 is represented by a polynomial function of the laser intensity (LDP) of the exposing device 200, the applied charging voltage (Cdc) for the charging device 301, and the developing bias (Vd) of the developing device 102, then changes of the L component with respect to Vb are plotted when Cdc and LDP are fixed to some values. This graph is expressed by a two-dimensional equation as follows:

$$L=0.00021\cdot LDP^2-0.000055\cdot Vb^2-0.0196\cdot Cdc-0.0537\cdot LDP+0.0196\cdot Vb+83.84$$

A relation between the process parameter u(k) and an image factor y(k) related to image formation at step k (k-th sheet of paper) can be described as the following Equation (1) where an output initial value y(1) is an output with respect to a nominal set value u(0), from Taylor expansion of the multivariate function G.

$$y(k+1)=y(k)+\left.\frac{\partial G}{\partial u}\right|_{u(k-1)}(u(k)-u(k-1)) \tag{1}$$

Here, if the controller K decides not the process parameter u(k) itself but decides a difference v(k) thereof, then it can be described as the following Equation (2).

$$u(k)=u(k-1)+v(k) \tag{2}$$

Moreover, as shown in the following Equation (3), a matrix representing the change of an output with respect to the change of the process parameter u(k) is defined as a Jacobian matrix at each step k.

$$B(k)=\left.\frac{\partial G}{\partial u}\right|_{u(k-1)} \tag{3}$$

However, because the multivariate function G is generally nonlinear, the matrix B(k) changes at each step. Therefore, the system represented by the Equation (1) can be described by a state equation (4) as follows as a linear time-varying system where x is a state variable and d is disturbance.

$$x(k+1)=Ax(k)+B(k)v(k)+d(k),\ A=I$$

$$y(k)=Cx(k),\ C=I \tag{4}$$

Particularly, the matrix B(k) is dependent on the process parameter u at time k−1, and thus it can be described as the following Equation.

$$B(k)=B(u(k-1))$$

This is the system called LPV (Linear Parameter Varying). At each step k, the matrix B(k) changes at each time according to a previous parameter set value u(k−1). By this operation, the control in the system with high non-linearity of the image forming process can be effectively performed.

As shown in FIG. 7, at step k, the controller K decides a control input v(k) from the output value y(k) and the target value r0. The control input v(k) is added to u(k−1) due to the Equation (2) and a process parameter is set to u(k). A value obtained by adding the disturbance d with an output from the process as a result of the setting is to be an output at step k+1.

Next, a plant-model synthesizing method will be explained below. There is synthesized a mathematical formula model, of the color of an arbitrary toner image measured by the spectrometer 109 and synthesized from a plurality of primary colors, representing a relation between the set value and the output color of the image forming unit, from the models for solid densities of the primary colors previously stored in the ROM 405.

Modeling of the system is to determine the matrix B(k) or the change of the output with respect to the change of the process parameter. For example, as shown in the patch patterns of FIG. 13, if each of the patch patterns is structured as monochrome, the matrix B(k) has a block diagonal structure as shown in the following Equation (31).

$$y(k+1)=y(k)+\begin{pmatrix} B^M(k) & & & 0 \\ & B^C(k) & & \\ & & B^Y(k) & \\ 0 & & & B^K(k) \end{pmatrix} v(k)+d(k) \tag{31}$$

Therefore, as shown in the followings, respective systems of CMYK can be independently considered.

$$y^M(k+1)=y^M(k)+B^M(k)v^M(k), y^C(k+1)=y^C(k)+B^C(k)v^C(k)$$

$$y^Y(k+1)=y^Y(k)+B^Y(k)v^Y(k), y^K(k+1)=y^K(k)+B^K(k)v^K(k)$$

$$y^M=(L^M a^M b^M)^T, u^M=(Cdc^M LDP^M Vb^M)^T,$$

$$y^C=(L^C a^C b^C)^T, u^C=(Cdc^C LDP^C Vb^C)^T,$$

$$y^Y=(L^Y a^Y b^Y)^T, u^Y=(Cdc^Y LDP^Y Vb^y)^T,$$

$$y^K=(L^K a^K b^K)^T, u^K=(Cdc^K LDP^K Vb^K)^{T^T}$$

Values of L, a, b, like L shown in FIG. 14, are given as shown in the following Equation (6) as functions of the laser intensity (LDP) of the exposing device 200, the applied charging voltage (Cdc) for the charging device 301, and the developing bias (Vd) of the developing device 102.

$$\begin{cases} L=L(Cdc, LDP, Vb) \\ a=a(Cdc, LDP, Vb) \\ b=b(Cdc, LDP, Vb) \end{cases} \tag{6}$$

As explained above, when L, a, b are expressed by a polynomial equation of Cdc, LDP, and Vb, then B*(k) can be described as a 3×3 matrix shown in the following Equation (7).

$$B*(k)=\begin{pmatrix} \frac{\partial L}{\partial Cdc} & \frac{\partial L}{\partial LDP} & \frac{\partial L}{\partial Vb} \\ \frac{\partial a}{\partial Cdc} & \frac{\partial a}{\partial LDP} & \frac{\partial a}{\partial Vb} \\ \frac{\partial b}{\partial Cdc} & \frac{\partial b}{\partial LDP} & \frac{\partial b}{\partial Vb} \end{pmatrix}_{(Cdc(k),LDP(k),Vb(k))} \tag{7}$$

However, in the case of the pallet (gray of three colors of CMY, red/blue/green, etc.) formed from general color mixture, L, a, b are expressed as shown in the following Equation (8), and thus they do not have the block diagonal structure.

$$\begin{cases} L=L(Cdc^M, LDP^M, Vb^M, Cdc^C, LDP^C, Vb^C, \\ \quad Cdc^Y, LDP^Y, Vb^Y, Cdc^K, LDP^K, Vb^K) \\ a=a(Cdc^M, LDP^M, Vb^M, Cdc^C, LDP^C, Vb^C, \\ \quad Cdc^Y, LDP^Y, Vb^Y, Cdc^K, LDP^K, Vb^K) \\ b=b(Cdc^M, LDP^M, Vb^M, Cdc^C, LDP^C, Vb^C, \\ \quad Cdc^Y, LDP^Y, Vb^Y, Cdc^K, LDP^K, Vb^K) \end{cases} \tag{8}$$

As explained above, in the case of the general color mixture, an output color is decided by 12-dimensional manipulated variable. In a case of monochrome, a color a (any one of C, M, Y, and K) is decided by three manipulated variables u=(Cdc, LDP, Vd) of a corresponding single image forming unit. Therefore, to determine the functional relation y=G(u), an experiment for measuring an output color is simply conducted on a combination of values of the three manipulated variables. However, in the case of the color mixture, there become enormous combinations of values of 12 manipulated variables, which makes it impossible to conduct such an experiment as above.

The problem can be solved by using a color mixture model such as a Neugebauer equation. First, for simplification, a case of three image forming units of cyan, magenta, and yellow will be considered. If reflectivity RGB of a color generated by mixture of the three colors or a tristimulus value XYZ is vector x, then x is represented by the next Equation (32) due to the Neugebauer equation.

$$\begin{aligned} x &= A_w x_w + A_c x_c + A_m x_m + A_y x_y + A_r x_r + A_g x_g + \\ &\quad A_b x_b + A_{3p} x_{3p} \\ &= (1-a_c)(1-a_m)(1-a_y)x_w + a_c(1-a_m)(1-a_y)x_c + \\ &\quad (1-a_c)a_m(1-a_y)x_m + (1-a_c)(1-a_m)a_y x_y + \\ &\quad (1-a_c)a_m a_y x_r + a_c(1-a_m)a_y x_g + a_c a_m(1-a_y)x_b + \\ &\quad a_c a_m a_y x_{3p} \end{aligned} \tag{32}$$

Hear $x_w$ is (reflectivity/tristimulus value) of paper, $x_c$ is (reflectivity/tristimulus value) of cyan, $x_m$ is (reflectivity/tristimulus value) of magenta, $x_y$ is (reflectivity/tristimulus value) of yellow, $x_r$ is (reflectivity/tristimulus value) of an overlap of magenta and yellow, $x_g$ is (reflectivity/tristimulus value) of an overlap of cyan and yellow, $x_b$ is (reflectivity/tristimulus value) of an overlap of magenta and cyan, and $x_{3p}$ is (reflectivity/tristimulus value) of an overlap of the three colors. Furthermore, $a_c$, $a_m$, and $a_y$ are areas occupied by the three colors (cyan, magenta, yellow) in unit area, respectively.

Moreover, if a*b and a/b are a product and a quotient for each elements of two vectors: $a=(a_1, a_2, a_3)$ and $b=(b_1, b_2, b_3)$ respectively, or if a*b and a/b are defined as $a*b=(a_1 \cdot b_a, a_2 \cdot b_2, a_3 \cdot b_3)$ and $a/b=(a_1/b_1, a_2/b_2, a_3/b_3)$ respectively, then they can be represented as follows using approximation due to Pollak.

$$x_r=x_w*(x_m/x_w)*(x_y/x_w)$$

$$x_g=x_w*(x_c/x_w)*(x_y/x_w)$$

$$x_b=x_w*(x_c/x_w)*(x_m/x_w)$$

$$x_{3p}=x_w*(x_c/x_w)*(x_m/x_w)*(x_y/x_w)$$

Therefore, the Neugebauer equation can be represented as the following form.

$$x=x_w*\{1-a_c+a_c(x_c/x_w)\}*\{1-a_m+a_m(x_m/x_w)\}*\{1-a_y+a_y(x_y/x_w)\}$$

This analysis can be extended into the case of the four image forming units including black (K). If reflectivity RGB of the color generated by mixture of the four primary colors or tristimulus value XYZ is vector x, then x is represented by the next Equation (33) due to the Neugebauer equation.

$$x=x_w*\{1-a_c+a_c(x_c/x_w)\}*\{1-a_m+a_m(x_m/x_w)\}*\{1-a_y+a_y(x_y/x_w)\}*\{1-a_k+a_k(x_k/x_w)\} \tag{33}$$

Here, $a_c$ and $x_k$ are an area occupied by black (K) and (reflectivity/tristimulus value), respectively.

(Reflectivity/tristimulus value) $x_c$, $x_m$, $x_y$, $x_k$ of the four primary colors are decided by manipulated variables of corresponding image forming units C, M, Y, K: $u_C=(Cdc_C, LDP_C, Vd_C)$, $u_M=(Cdc_M, LDP_M, Vd_M)$, $u_Y=(Cdc_Y, LDP_Y, Vd_Y)$, and $u_K-(Cdc_K, LDP_K, Vd_K)$, respectively.

$$x_c(u^c,u^m,u^y,u^k)=x_c(u^c)$$

$$x_m(u^c,u^m,u^y,u^k)=x_m(u^c)$$

$$x_y(u^c,u^m,u^y,u^k)=x_y(u^c)$$

$$x_k(u^c,u^m,u^y,u^k)=x_k(u^c)$$

In addition, (reflectivity/tristimulus value) $x_w$ of paper is not dependent on image formation. (Reflectivity/tristimulus value) x of an arbitrary color is a function of $(u_C, u_M, u_Y, u_K)$, and thus x can be represented by the following Equation (34).

$$x(u^c, u^m, u^y, u^k) = x_w*\{1-a_c+a_c(x_c(u^c)/x_w)\}*\{1-a_m+a_m(x_m(u^m)/x_w)\}*\{1-a_y+a_y(x_y(u^y)/x_w)\}*\{1-a_k+a_k(x_k(u^k)/x_w)\}$$

Next, the Equation (34) is used to synthesize a mathematical formula model describing a relation between a manipulated variable of an image forming unit and (reflectivity/tristimulus value) of an output color related to the arbitrary color. An expression of values of L*a*b* for arbitrary N colors using an LPV system is given as the following Equation (35).

$$y(i+1) = y(i) + \begin{pmatrix} B_1^c(i) & B_1^m(i) & B_1^y(i) & B_1^k(i) \\ B_2^c(i) & B_2^m(i) & B_2^y(i) & B_2^k(i) \\ \vdots & \vdots & \vdots & \vdots \\ B_N^c(i) & B_N^m(i) & B_N^y(i) & B_N^k(i) \end{pmatrix} v(i) + d(i) \tag{35}$$

Here, a vector y(i) is a vector in which L*a*b* values of colors $y_j(i)$, j=1, 2, . . . , N, are arranged at step i.

$$y(i) = \begin{pmatrix} y_1(i) \\ y_2(i) \\ \vdots \\ y_N(i) \end{pmatrix}, \; y_j(i) = \begin{pmatrix} L_j(i) \\ a_j(i) \\ b_j(i) \end{pmatrix}$$

A vector v(i) is a difference of vector u(i) in which set values of the four image forming units are arranged at step i.

$$v(i) = u(i) + u(i-1), \; u(i) = \begin{pmatrix} u^c(i) \\ u^m(i) \\ u^y(i) \\ u^k(i) \end{pmatrix},$$

$$u^c(i) = \begin{pmatrix} Cdc^c(i) \\ LDP^c(i) \\ Vb^c(i) \end{pmatrix}, \; u^m(i) = \begin{pmatrix} Cdc^m(i) \\ LDP^m(i) \\ Vb^m(i) \end{pmatrix},$$

$$u^y(i) = \begin{pmatrix} Cdc^y(i) \\ LDP^y(i) \\ Vb^y(i) \end{pmatrix}, \; u^k(i) = \begin{pmatrix} Cdc^k(i) \\ LDP^k(i) \\ Vb^k(i) \end{pmatrix}$$

The matrix B(i) is a Jacobian matrix of L*a*b* values on each color $y_j(i)$, j=1, 2, . . . , N.

$$B_j^c(i) = \left.\frac{\partial y_j}{\partial u^c}\right|_{u^c=u^c(i)} = \begin{pmatrix} \frac{\partial L_j}{\partial u^c} \\ \frac{\partial a_j}{\partial u^c} \\ \frac{\partial b_j}{\partial u^c} \end{pmatrix}_{u^c=u^c(i)} = \begin{pmatrix} \frac{\partial L_j}{\partial Cdc^c} & \frac{\partial L_j}{\partial LDP^c} & \frac{\partial L_j}{\partial Vb^c} \\ \frac{\partial a_j}{\partial Cdc^c} & \frac{\partial a_j}{\partial LDP^c} & \frac{\partial a_j}{\partial Vb^c} \\ \frac{\partial b_j}{\partial Cdc^c} & \frac{\partial b_j}{\partial LDP^c} & \frac{\partial b_j}{\partial Vb^c} \end{pmatrix}_{u^c=u^c(i)} \tag{36}$$

$$B_j^m(i) = \left.\frac{\partial y_j}{\partial u^m}\right|_{u^m=u^m(i)} = \begin{pmatrix} \frac{\partial L_j}{\partial u^m} \\ \frac{\partial a_j}{\partial u^m} \\ \frac{\partial b_j}{\partial u^m} \end{pmatrix}_{u^m=u^m(i)} = \begin{pmatrix} \frac{\partial L_j}{\partial Cdc^m} & \frac{\partial L_j}{\partial LDP^m} & \frac{\partial L_j}{\partial Vb^m} \\ \frac{\partial a_j}{\partial Cdc^m} & \frac{\partial a_j}{\partial LDP^m} & \frac{\partial a_j}{\partial Vb^m} \\ \frac{\partial b_j}{\partial Cdc^m} & \frac{\partial b_j}{\partial LDP^m} & \frac{\partial b_j}{\partial Vb^m} \end{pmatrix}_{u^m=u^m(i)}$$

-continued $$B_j^y(i) = \frac{\partial y_j}{\partial u^y}\bigg|_{u^y=u^y(i)} = \begin{pmatrix} \frac{\partial L_j}{\partial u^y} \\ \frac{\partial a_j}{\partial u^y} \\ \frac{\partial b_j}{\partial u^y} \end{pmatrix}_{u^y=u^y(i)} =$$

$$\begin{pmatrix} \frac{\partial L_j}{\partial Cdc^y} & \frac{\partial L_j}{\partial LDP^y} & \frac{\partial L_j}{\partial Vb^y} \\ \frac{\partial a_j}{\partial Cdc^y} & \frac{\partial a_j}{\partial LDP^y} & \frac{\partial a_j}{\partial Vb^y} \\ \frac{\partial b_j}{\partial Cdc^y} & \frac{\partial b_j}{\partial LDP^y} & \frac{\partial b_j}{\partial Vb^y} \end{pmatrix}_{u^y=u^y(i)}$$

$$B_j^k(i) = \frac{\partial y_j}{\partial u^k}\bigg|_{u^k=u^k(i)} = \begin{pmatrix} \frac{\partial L_j}{\partial u^k} \\ \frac{\partial a_j}{\partial u^k} \\ \frac{\partial b_j}{\partial u^k} \end{pmatrix}_{u^k=u^k(i)} =$$

$$\begin{pmatrix} \frac{\partial L_j}{\partial Cdc^k} & \frac{\partial L_j}{\partial LDP^k} & \frac{\partial L_j}{\partial Vb^k} \\ \frac{\partial a_j}{\partial Cdc^k} & \frac{\partial a_j}{\partial LDP^k} & \frac{\partial a_j}{\partial Vb^k} \\ \frac{\partial b_j}{\partial Cdc^k} & \frac{\partial b_j}{\partial LDP^k} & \frac{\partial b_j}{\partial Vb^k} \end{pmatrix}_{u^k=u^k(i)}$$

If each element of the Equation (36) can be calculated, there can be constructed the mathematical formula model equation (35) describing the relation between the manipulated variable of the image forming unit and (reflectivity/tristimulus value) of the output color for an arbitrary color. A method of calculating each element of the Equation (36) will be explained below.

The elements of the Jacobian matrix can be calculated in the following manner based on the Equation (37).

$$\begin{aligned} \frac{\partial L}{\partial u^c} &= \frac{\partial L}{\partial X}\frac{\partial X}{\partial u^c} + \frac{\partial L}{\partial Y}\frac{\partial Y}{\partial u^c} + \frac{\partial L}{\partial Z}\frac{\partial Z}{\partial u^c} \\ &= a_X\frac{\partial L}{\partial X}\frac{dX_c(u^c)}{du^c} + a_Y\frac{\partial L}{\partial Y}\frac{dY_c(u^c)}{du^c} + a_Z\frac{\partial L}{\partial Z}\frac{dZ_c(u^c)}{du^c} \end{aligned} \tag{37}$$

$$\begin{aligned} \frac{\partial a}{\partial u^c} &= \frac{\partial a}{\partial X}\frac{\partial X}{\partial u^c} + \frac{\partial a}{\partial Y}\frac{\partial Y}{\partial u^c} + \frac{\partial a}{\partial Z}\frac{\partial Z}{\partial u^c} \\ &= a_X\frac{\partial a}{\partial X}\frac{dX_c(u^c)}{du^c} + a_Y\frac{\partial a}{\partial Y}\frac{dY_c(u^c)}{du^c} + a_Z\frac{\partial a}{\partial Z}\frac{dZ_c(u^c)}{du^c} \end{aligned}$$

$$\begin{aligned} \frac{\partial b}{\partial u^c} &= \frac{\partial b}{\partial X}\frac{\partial X}{\partial u^c} + \frac{\partial b}{\partial Y}\frac{\partial Y}{\partial u^c} + \frac{\partial b}{\partial Z}\frac{\partial Z}{\partial u^c} \\ &= a_X\frac{\partial b}{\partial X}\frac{dX_c(u^c)}{du^c} + a_Y\frac{\partial b}{\partial Y}\frac{dY_c(u^c)}{du^c} + a_Z\frac{\partial b}{\partial Z}\frac{dZ_c(u^c)}{du^c} \end{aligned}$$

Here, $\alpha_x$, $\alpha_y$, and $\alpha_z$ are give by the following Equation (38).

$$\begin{cases} a_X \equiv a_c\left(1 - a_m + a_m\frac{X_m}{X_w}\right)\left(1 - a_y + a_y\frac{X_y}{X_w}\right)\left(1 - a_k + a_k\frac{X_k}{X_w}\right) \\ a_Y \equiv a_c\left(1 - a_m + a_m\frac{Y_m}{Y_w}\right)\left(1 - a_y + a_y\frac{Y_y}{Y_w}\right)\left(1 - a_k + a_k\frac{Y_k}{Y_w}\right) \\ a_Z \equiv a_c\left(1 - a_m + a_m\frac{Z_m}{Z_w}\right)\left(1 - a_y + a_y\frac{Z_y}{Z_w}\right)\left(1 - a_k + a_k\frac{Z_k}{Z_w}\right) \end{cases} \tag{38}$$

Furthermore, partial differentials of L, a, b related to X, Y, Z can be calculated by the following Equation (39).

$$\begin{aligned} &L = 116f\left(\frac{Y}{Y_n}\right) - 16, \\ &a = 500\left\{f\left(\frac{X}{X_n}\right) - f\left(\frac{Y}{Y_n}\right)\right\},\ b = 200\left\{f\left(\frac{Y}{Y_n}\right) - f\left(\frac{Z}{Z_n}\right)\right\} \\ &f(t) = \begin{cases} 7.787t + \frac{16}{116} & 0 \le t \le 0.008856 \\ t^{1/3} & 0.008856 < t \le 1 \end{cases} \end{aligned} \tag{39}$$

Here, $X_n$, $Y_n$, and $Z_n$ are tristimulus values of illumination. A vector:

$$\frac{dX_c(u^c)}{du^c},\ \frac{dY_c(u^c)}{du^c},\ \frac{dZ_c(u^c)}{du^c}, \tag{40}$$

for a one-colored cyan is previously determined from experiments and is stored in the ROM 405. Then, the Equation (37) can be calculated from the Equation (38), Equation (39), and Equation (40), and thus the following:

$$B_j^c(i)$$

can be calculated. Similarly, $$B_j^m(i), B_j^y(i), B_j^k(i)$$

can also be calculated. Thus, all the elements of the Equation (36) are calculated, which allows calculation of the Equation (35).

In the method of deciding the manipulated variables for the process parameters at Step S3, the design method of the controller K at step k as shown in FIG. 7 is the same as that of the first embodiment, and thus explanation thereof is omitted.

Figure 15:
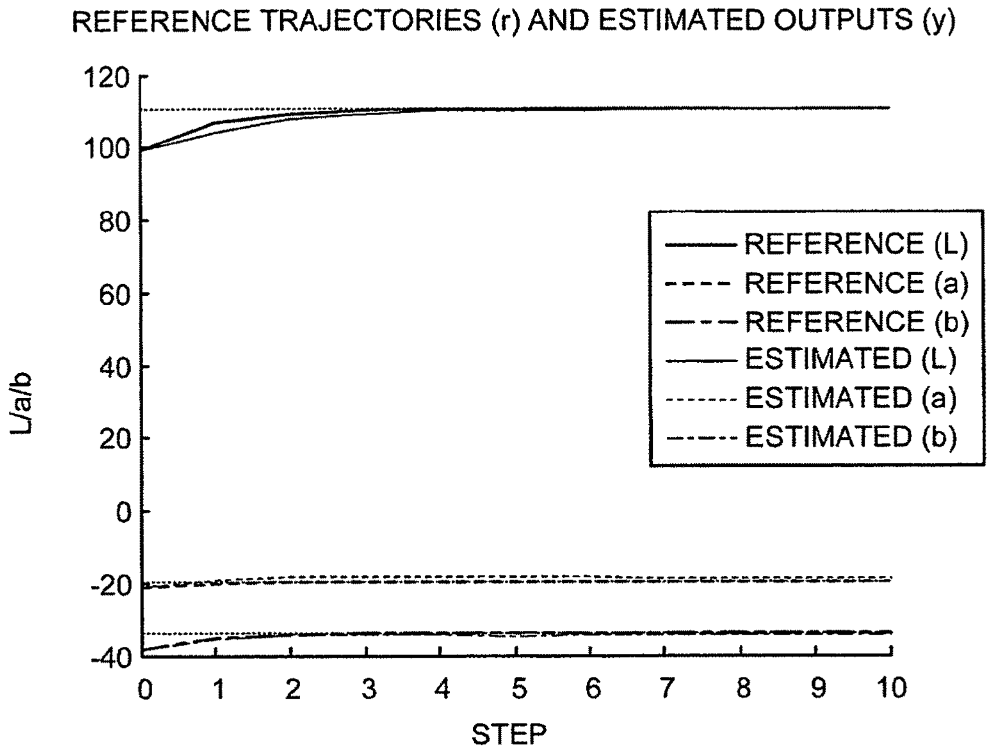
FIG. 15 is a graph representing examples of reference trajectories and calculated control inputs.

FIG. 15 is a graph representing examples of reference trajectories and calculated control inputs. It should be noted that FIG. 15 represents one patch among the patch patterns shown in FIG. 13 or represents one color.

Figure 16:
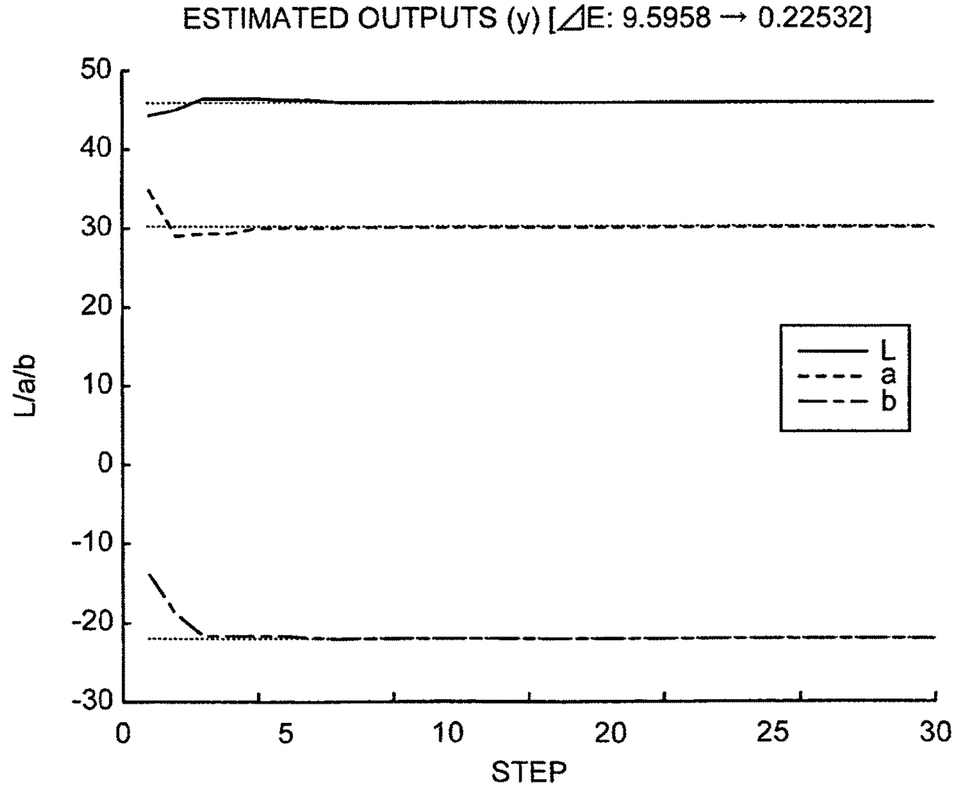
FIG. 16 is a graph representing changes of outputs due to feedback control.

Next, FIG. 16 represents examples of how the output value y(k) changes when the operations as shown in FIG. 5 are applied. The horizontal-axis of the graph in FIG. 16 represents an output paper number or represents the number of feedbacks when feedback control is provided for not all the sheets of paper but for each several sheets of paper. The output value y(k) is "blue" obtained by an overlap of cyan and magenta. The vertical-axis of the graph in FIG. 16 represents each coordinate value in the L*a*b* color space, and dotted lines are target values at respective coordinates. As explained above, there is a difference of ΔE=9.6 between the target value and the output color on the first sheet, however, the output y follows the target value through real-time feedback control without stopping the printing operation.

Figure 17:
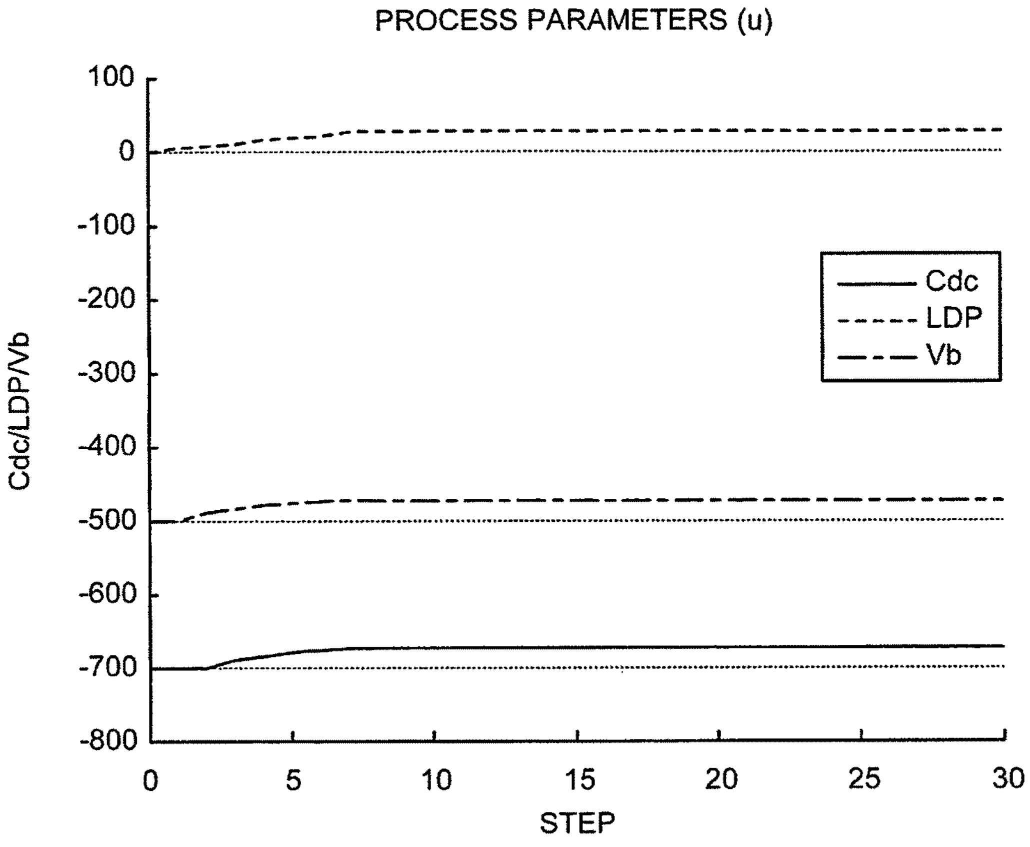
FIG. 17 is a graph representing changes of the process parameters due to the feedback control.
Figure 18:
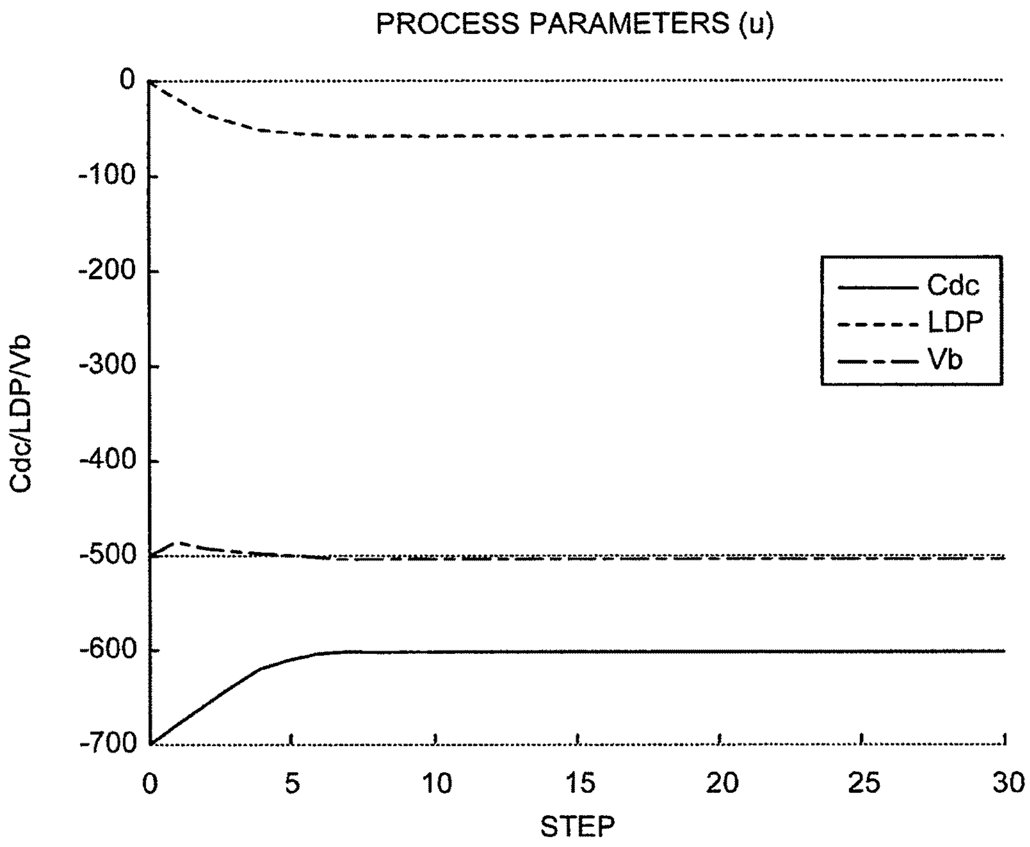
FIG. 18 is a graph representing changes of the process parameters due to the feedback control.

FIG. 17 and FIG. 18 represent examples of how the process parameter u(k) changes when the processes as shown in FIG. 5 are applied. The horizontal-axis of the graphs in FIG. 17 and FIG. 18 is the same as that in FIG. 16, and represents an output paper number or represents the number of feedbacks when feedback control is provided for not all the sheets of paper but for each several sheets of paper. The vertical-axis of the graph in FIG. 17 represents the laser intensity (LDP) of the exposing device 200, the applied charging voltage (Cdc) for the charging device 301, and the developing bias (Vd) of the developing device 102 in the image forming unit for cyan. The vertical-axis of the graph in FIG. 18 represents the laser intensity (LDP) of the exposing device 200, the applied charging voltage (Cdc) for the charging device 301, and the developing bias (Vd) of the developing device 102 in the image forming unit for magenta. In this manner, the process parameters are converged to optimal values through real-time feedback control without stopping the printing operation.

As explained above, according to the second embodiment, there is provided a unit that determines a series of the manipulated variables so that the toner images approach the reference trajectories representing the ideal time variation from the current state of the toner images to a desired state thereof, while minimizing the constraint evaluation function related to the constraint conditions for the manipulated variables using the estimation equation for approximating time-series variation in the state of the toner images through repetition of the feedback control. The unit can decide set values for the process parameters related to the image formation according to the manipulated variables decided based on the difference between the measured value fed-back from the measured value of a toner image of an arbitrary color and the preset target value, without previously limiting the color of the toner image to be measured.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An image forming apparatus comprising:

an image forming unit that forms an image;

a color measuring unit that measures a color of the image;

a measured-value acquiring unit that acquires a measured value that is measured by the color measuring unit; and a feed-back unit to feed back the measured value;

a set-value deciding unit that decides a set value with reference to a process parameter related formation of the image according to an operation amount decided on a difference between the measured value that has been fed-back and a present target value, wherein the set-value deciding unit determines the set value so that the image approaches a reference value in a period from a current state of the image to desired state of the image while optimizing a constraint evaluation function related to a constraint condition for the formation of the image by using an estimation equation for approximating time-series variation in a state of the image, the estimation equation includes a matrix that represents an output change in accordance to a change of the process parameter, and the matrix is charged in accordance with the set value regarding to the latest process parameter.

2. The image forming apparatus according to claim 1, wherein the set-value deciding unit uses a solving method of quadratic programming when obtaining the most optimized series of the operation values that minimize the constraint evaluation function.

3. The image forming apparatus according to claim 1, wherein the set-value deciding unit determines a series of manipulated variables so that the images approach reference values representing ideal time variation from a current state to a desired state while minimizing a constraint evaluation function related to constraint conditions for the manipulated variables using an estimation equation for approximating time-series variation in the state of the images via repetition of the feedback control.

4. The image forming apparatus according to claim 1, wherein the estimation equation is defined as:

$$y(k+j)=y(k)+B(k)v(k)$$

where y(k+j) is the predicted output, y(k) is the measured value that has been fed-back, B(k) is the matrix, and v(k) is the difference between the measured value that has been fed-back and the present target value.

5. The image forming apparatus according to claim 1, further comprising a main-body control unit to acquire color information measured from the images fixed on a transfer recording medium through the measured-value acquiring unit.

6. The image forming apparatus according to claim 1, wherein the process parameter related to formation of the image is at least one of a laser intensity of an exposing device, an applied charging voltage for a charging device, and a developing bias of a developing device.

7. The image forming apparatus according to claim 6, wherein the process parameter is output to an image forming unit.

8. An image forming method for forming an image using an electrophotographic process, the image forming method comprising:

acquiring a measured value of a color of the image in a measured-value acquiring unit;

feed-backing the measured value in a feed-back unit;

deciding a set value with reference to a process parameter related formation of the image according to an operation amount decided on a difference between the measured value that has been fed-back and a present target value, wherein in the set-value deciding unit, the set value is determined so that the image approaches a reference value in a period from a current state of the image to its desired state of the image while optimizing a constraint evaluation function related to a constraint condition for the formation of the image by using an estimation equation for approximating time-series variation in a state of the image at the deciding, the estimation equation includes a matrix that represents an output change in accordance to a change of the process parameter, and the matrix is charged in accordance with the set value regarding to the latest process parameter.

9. The method according to claim 8, wherein the set-value deciding unit uses a solving method of quadratic programming when obtaining the most optimized series of the operation values that minimize the constraint evaluation function.

10. The method according to claim 8, wherein the set-value deciding unit determines a series of manipulated variables so that the images approach reference values representing ideal time variation from a current state to a desired state while minimizing a constraint evaluation function related to constraint conditions for the manipulated variables using an estimation equation for approximating time-series variation in the state of the images via repetition of the feedback control.

11. The method according to claim 8, wherein the estimation equation is defined as:

$$y(k+j)=y(k)+B(k)v(k)$$

where y(k+j) is the predicted output, y(k) is the measured value that has been fed-back, B(k) is the matrix, and v(k) is the difference between the measured value that has been fed-back and the present target value.

12. The method according to claim 8, further comprising a main-body control unit to acquire color information measured from the images fixed on a transfer recording medium through the measured-value acquiring unit.

13. The method according to claim 8, wherein the process parameter related to formation of the image is at least one of a laser intensity of an exposing device, an applied charging voltage for a charging device, and a developing bias of a developing device.

14. The method according to claim 13, wherein the process parameter is output to an image forming unit.

* * * * *